(12) United States Patent
Makino et al.

(10) Patent No.: US 7,419,758 B2
(45) Date of Patent: Sep. 2, 2008

(54) LITHOGRAPHIC PRINTING PLATE PRECURSOR AND LITHOGRAPHIC PRINTING METHOD

(75) Inventors: Naonori Makino, Shizuoka (JP); Toshifumi Inno, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 329 days.

(21) Appl. No.: 11/115,113

(22) Filed: Apr. 27, 2005

(65) Prior Publication Data

US 2005/0244746 A1 Nov. 3, 2005

(30) Foreign Application Priority Data

Apr. 28, 2004 (JP) ............ P.2004-134480

(51) Int. Cl.
*G03F 7/00* (2006.01)
*G03F 7/004* (2006.01)

(52) U.S. Cl. .................. 430/270.1; 430/302

(58) Field of Classification Search ......... 430/270.1, 430/302
See application file for complete search history.

(56) References Cited

U.S. PATENT DOCUMENTS

| 5,240,808 | A | * | 8/1993 | Aoshima et al. ............ 430/175 |
|---|---|---|---|---|
| 6,716,569 | B2 | * | 4/2004 | Hotta et al. ................. 430/302 |
| 6,746,812 | B2 | * | 6/2004 | Watanabe et al. ........... 430/165 |
| 6,884,565 | B2 | * | 4/2005 | Takahashi et al. ......... 430/270.1 |
| 6,977,132 | B2 | * | 12/2005 | Yamasaki et al. ......... 430/270.1 |
| 2001/0009129 | A1 | * | 7/2001 | Kunita et al. ................ 101/453 |
| 2002/0012878 | A1 | | 1/2002 | Hauck et al. |
| 2002/0039703 | A1 | * | 4/2002 | Hotta et al. ................. 430/302 |
| 2003/0113667 | A1 | | 6/2003 | Matsumura |

FOREIGN PATENT DOCUMENTS

| EP | 0851299 A1 | 7/1998 |
|---|---|---|
| EP | 1 500 498 A2 | 1/2005 |
| JP | 02304441 A * | 12/1990 |
| JP | 11-30858 A | 2/1999 |
| JP | 2938397 B2 | 6/1999 |
| JP | 2001-277740 A | 10/2001 |
| JP | 2001-277742 A | 10/2001 |
| JP | 2002-287334 A | 10/2002 |

* cited by examiner

*Primary Examiner*—Amanda C. Walke
(74) *Attorney, Agent, or Firm*—Birch, Stewart, Kolasch & Birch, LLP

(57) ABSTRACT

A lithographic printing plate precursor comprising an image recording layer containing a sensitizing dye, a polymerization initiator, a polymerizable compound and a binder polymer and a hydrophilic support, wherein the image recording layer or a layer optionally provided between the image recording layer and the hydrophilic support contains a compound capable of forming an adsorptive group to the hydrophilic support due to heat, an acid or a radical.

8 Claims, No Drawings

LITHOGRAPHIC PRINTING PLATE PRECURSOR AND LITHOGRAPHIC PRINTING METHOD

FIELD OF THE INVENTION

This invention relates to a lithographic printing plate precursor and a lithographic printing method using the same.

BACKGROUND OF THE INVENTION

In general, a lithographic printing plate consists of a lipophilic image part which receives an ink in the course of printing and a hydrophilic non-image part (an ink-unreceiving part) which receives a fountain solution. In lithographic printing, printing is made by taking advantage of the properties of water and an oily ink repealing each other. As a result, the ink unevenly adheres to the surface of the lithographic printing plate, i.e., the ink adheres exclusively to the mage part. Next, the ink is transferred onto a print substrate such as paper, thereby completing printing.

To construct a lithographic printing plate, it has been a common practice to use a lithographic printing plate precursor (a PS plate) having a lipophilic photosensitive resin layer (an image recording layer) formed on a hydrophilic support. A lithographic printing plate is usually made by exposing a lithographic printing plate precursor via a master such as a lith film and dissolving and removing the image recording layer in the non-image part with the use of an alkaline developing solution or an organic solvent while remaining the image recording layer in the image part to thereby expose the surface of the hydrophilic support.

In the plate making process with the use of a conventional lithographic printing plate precursor, it is necessary to employ the step of dissolving and removing the non-image part with a developing solution after the exposure. Recently, it is a technical problem to omit or simplify such an additional wet treatment as the development step. In recent years, the disposal of waste solutions discharged in association with the wet treatment has attracted much industrial attention from the viewpoint of global environment. That is to say, there is an increasing demand for omitting the wet treatment from the environmental viewpoint.

As one of simplified plate making methods, there has been proposed a so-called onboard development method, which comprises, after exposing, removing a non-image part on a printing machine to give a lithographic printing plate. In this method, use is made of an image recording layer allowing the removal of a non-image part of a lithographic printing plate precursor during the common printing process Specific examples of the onboard development method include a method with the use of a lithographic printing plate precursor having an image recording layer which can be dissolved or dispersed in a fountain solution, an ink solvent or am emulsion of a fountain solution with an ink; a method of mechanically removing an image recording layer by contacting it with rollers or a blanket cylinder of a printing machine; and a method wherein the cohesive force of an image recording layer or the adhesion between the image recording layer and a support is weakened by the penetration of a fountain solution, an ink solvent or the like and then the image recording layer is mechanical removed by contacting it with rollers or a blanket cylinder.

Unless otherwise noted, the term "development treatment" as used herein means the step of removing a non-image part of a lithographic printing plate precursor by using an apparatus (usually an automatic developing machine) other than a printing machine and contacting the printing plate precursor with a liquid (usually an alkaline developing solution) to thereby expose the surface of a hydrophilic support. On the other hand, the term "onboard development" means the method and step of removing a non-image part of a lithographic printing plate precursor by using a printing machine and contacting the printing plate precursor with a liquid (usually a printing ink and/or a fountain solution) to thereby expose the surface of a hydrophilic support.

In the case of using an image recording layer of the conventional image recording system with the use of ultraviolet light or visible light, however, the image recording layer would not sufficiently fixed after the exposure. Therefore, it is necessary to employ some troublesome procedures, for example, storing a printing plate precursor in a completely light-blocked state or at a constant temperature.

With the recent spread of digitalization techniques of electronically processing, accumulating and outputting image data with a computer, various image output systems appropriate for these digitalization techniques have been put into practical use. Thus, there have been developed computer to plate techniques whereby a printing plate is directly exposed, without resort to a lith film, by scanning highly directional radiant rays such as laser beams on the printing plate in accordance with digitalized image data. Accordingly, it is one of important technical problems to obtain a lithographic printing plate appropriate for these systems.

As discussed above, it has been more urgently required in recent years to simplify the plate making procedures, employ a dry system and omit the wet treatment from the viewpoints of global environment and adaptation to digitalization.

In recent years, high output lasers such as semiconductor lasers and YAG lasers are available less expensively. Accordingly, it is highly expected that these high output lasers are useful as image recording light sources in a method of producing a lithographic printing plate precursor by scanning exposure which can be easily incorporated into the digitalization technology.

In the conventional plate making method, a photosensitive lithographic printing plate precursor is imagewise-exposed at a low to medium illumination intensity and thus an image is recorded via an imagewise change in a physical property due to a photochemical reaction in the image recording layer. In the method with the use of the high-output lasers as described above, in contrast thereto, an area to be exposed is radiated with much light energy within an extremely short time. Thus, the light energy is efficiently converted into heat energy, thereby inducing a heat change such as a chemical change, a phase change or a morphological or structural change in the image recording layer. Using this change, an image is recorded. That is to say, the image data is input by the light energy such as laser beams, while image recording is carried out by using not only the light energy but also the reaction by heat energy. Such a recording system with the use of the heat generated by high power density exposure is called "heat mode recording" and the conversion of light energy into heat energy is called "photothermal conversion".

Large merits of the plate making method with the use of the heat mode recording reside in that the image recording layer would not become light-struck at an ordinary illumination level such as room light, and that fixation of an image recorded by high illumination exposure is not essentially required. That is, a lithographic printing plate precursor to be used in heat mode recording is free from any fear of light-struck due to room light before the exposure and the fixation of an image is not essentially required after the exposure. When a plate making process, wherein an image recording layer insolubilized or solubilized by the exposure using high output lasers is employed and the imagewise-exposed image recording layer is employed as a lithographic printing plate, is carried out by the onboard development method, for example, it is expected that a printing system in which an image is not affected even though it is exposed to environmental room light after the exposure could be obtained. Accordingly, it is expected that use of the heat mode recording enables the acquisition of a lithographic printing plate precursor appropriately usable in the onboard development method.

Thanks to the-remarkable progress in laser technology in these days, high-power and small sized semiconductor lasers and solid lasers emitting infrared rays of 760 nm to 1200 nm in wavelength are easily available. These infrared lasers are highly useful as recording light sources in direct plate-making of digital data from computers, etc.

However, many of photosensitive recording materials useful as an image recording layer in practice have photosensitive wavelength within the visible light region of 760 nm or below and, therefore, image recording cannot made with infrared laser beams. Therefore, it has been required to develop a material allowing infrared laser image recording.

To satisfy such a requirement, a lithographic printing plate precursor having an image recording layer, in which hydrophobic thermoplastic polymer particles are dispersed in a hydrophilic binder, provided on a hydrophilic support is proposed (see, for example, Japanese Patent No. 2938397). This lithographic printing plate precursor is exposed by infrared laser beams and thus the hydrophobic thermoplastic polymer particles are thermally bonded together to form an image. Then it is loaded on a cylinder of a printing machine and a fountain solution and/or an ink are supplied to it. Thus, onboard development can be carried out.

Although this system wherein an image is formed by bonding fine particles merely via heat fusion shows favorable onboard development properties, the obtained image is very poor in strength (adhesion to the support) and thus no sufficient printing tolerance can be established.

There is also proposed a lithographic printing plate precursor which contains microcapsules having a polymerizable compound encapsulated therein on a hydrophilic support (see, for example, JP-A-2001-277740 and JP-A-2001-277742).

Moreover, a lithographic printing plate precursor which has a photosensitive layer containing an infrared absorbing agent, a radical polymerization initiator and a polymerizable compound on a support is proposed (see, for example, JP-A-2002-287334).

The above-described methods using polymerization are characterized in that relatively high image strength can be achieved thereby, since chemical bond density in an image part is higher than that of an image formed by the heat fusion of fine polymer particles. From a practical viewpoint, however, the onboard development properties, printing tolerance and polymerization efficiency (sensitivity) still remain insufficient. Therefore, these methods have not been put into practical use yet.

There has been proposed to add a phosphoric ester monomer to a lithographic printing plate precursor of the photopolymerization initiator system (see, for example, JP-A-11-30858). The phosphoric ester moiety of the phosphoric ester monomer has a function of adsorbing to the support surface. The monomer moiety of the phosphoric ester monomer is hardened by photopolymerization. By adding the phosphoric ester monomer to the photosensitive layer, therefore, the adhesion of a hardened image to the support is enhanced in an exposed part and, in its turn, the printing tolerance is improved.

SUMMARY OF THE INVENTION

In the course of studies on a lithographic printing plate precursor having a phosphoric ester monomer in the photosensitive layer, the inventors found stains in non-image parts of printings. More specifically speaking, it was clarified that, in the case where a lithographic printing plate precursor containing a phosphoric ester monomer was loaded on a printing machine and printing was carried out after image formation, stains in a non-image part of the printing became serious. According to the inventor's studies, the phosphoric ester monomer was not removed by the onboard development but remained in a trace amount of in an unexposed part. Thus, it was assumed that the staining might be caused by the remaining phosphoric ester monomer.

An object of the invention is to provide a lithographic printing plate precursor which is usable in image recording by laser exposure.

Another object of the invention is to provide a lithographic printing method wherein printing is carried out by recording an image on a lithographic printing plate precursor directly from digital data followed by onboard development without resort to a development treatment.

Still another object of the invention is to provide lithographic printing method whereby a large number of printed sheets with excellent printing qualities can be obtained by using a lithographic plate made by using a practically appropriate amount of energy.

The invention provides the lithographic printing plate precursors (1) to (5) and the lithographic printing method (6) as will be mentioned below.

(1) A lithographic printing plate precursor having an image recording layer containing a sensitizing dye, a polymerization initiator, a polymerizable compound and a binder polymer and a hydrophilic support, wherein the image recording layer or an optional layer provided between the image recording layer and the hydrophilic support contains a compound capable of forming an adsorptive group to the hydrophilic support due to heat, an acid or a radical.

(2) A lithographic printing plate precursor as described in the above (1), wherein the compound capable of forming an adsorptive group to the hydrophilic support due to heat, an acid or a radical has an ethylenically unsaturated bond.

(3) A lithographic printing plate precursor as described in the above (1), wherein the compound capable of forming an adsorptive group to the hydrophilic support due to heat, an acid or a radical is a polymer.

(4) A lithographic printing plate precursor as described in the above (1), wherein the compound capable of forming an adsorptive group to the hydrophilic support due to heat, an acid or a radical is a polymer having an ethylenically unsaturated bond.

(5) A lithographic printing plate precursor as described in the above (1), wherein the compound capable of forming an adsorptive group to the hydrophilic support due to heat, an acid or a radical is contained in an undercoat layer provided between the image recording layer and the hydrophilic support.

(6) A lithographic printing method wherein printing is carried out by loading a lithographic printing plate precursor, which has an image recording layer containing a sensitizing dye, la polymerization initiator, a polymerizable compound and a binder polymer and a hydrophilic support, wherein the image recording layer is removable by using a printing ink or a fountain solution and the image recording layer or an optional layer provided between the image recording layer and the hydrophilic support contains a compound capable of forming an adsorptive group to the hydrophilic support due to heat, an acid or a radical, on a printing machine followed by imagewise exposure to laser beams, or imagewise-exposing the lithographic printing plate precursor followed by loading on the printing machine, and then supplying the printing ink and the fountain solution to thereby remove an unexposed part of the image recording layer by the printing ink or the fountain solution.

The characteristic of the invention resides in substituting a compound (for example, a phosphoric ester) having an adsorptive group to a hydrophilic support by its precursor. As the precursor, use is made in practice of a compound capable of forming an adsorptive group to the hydrophilic support due to heat, an acid or a radical.

In an exposed part, the precursor is converted into a compound having an adsorptive group to the hydrophilic support. In an unexposed part, on the other hand, the precursor remains as such. S long as the precursor has no adsorptive group to the hydrophilic support, it would never adsorb to the hydrophilic support, thereby causing no staining in a non-image part.

By using the lithographic printing plate precursor according to the invention, therefore, onboard development quickly proceeds to give favorable printings free from background staining.

DETAILED DESCRIPTION OF THE INVENTION

[Compound Capable of Forming Adsorptive Group to Hydrophilic Support Due to Heat, Acid or Radical]

In the lithographic printing plate precursor according to the invention, the image recording layer or an optional layer provided between the image recording layer and the hydrophilic support contains a compound capable of forming an adsorptive group to the hydrophilic support due to heat, an acid or a radical.

The adsorptive group to the hydrophilic support means a group undergoing the formation of a bond (for example, an ionic bond, a hydrogen bond, a coordination bond or a bond due to intermolecular force) together with a metal, a metal oxide or a hydroxyl group on a support having been subjected to anodic oxidation or hydrophilization. As the support-adsorptive group, an acid group or an onium group is preferred.

An acid group having an acid dissociation constant (pKa) of 7 or lower is preferable. Examples of the acid group include phenolic hydroxyl group (—OH), carboxylate group (—COOH), sulfonate group (—SO$_3$H), sulfate group (—OSO$_3$H), phosphonate group (—PO$_3$H$_2$), phosphate group (—OPO$_3$H$_2$), phosphonamide group (—NH—PO$_3$H$_2$), —CONHSO$_2$—, —SO$_2$NHSO$_2$— and —COCH$_2$COCH$_3$—. Carboxylate group, sulfonate group, phosphate group and phosphonamide group are preferable.

As an onium group, those comprising the atoms belonging to the group 5B (the group 15) or the group 6B (the group 16) in the periodic table are preferable, onium groups comprising nitrogen, phosphorus or sulfur atom are still preferable and an onium group comprising a nitrogen atom is most desirable.

A compound can be converted into the corresponding precursor by blocking an adsorptive group with a protecting group. In the case where the adsorptive group is an acid group, for example, the compound can be converted into its precursor by esterifying the acid.

It is preferable that a compound forming an adsorptive group has an ethylenically unsaturated bond. It is also preferable that a compound having an ethylenically unsaturated bond and forming an adsorptive group to the hydrophilic support surface is represented by the following formula (I).

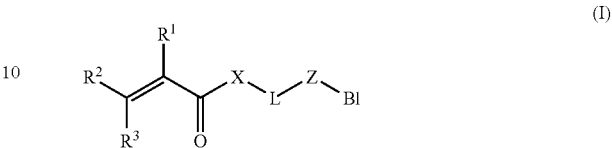

In the formula (I), $R^1$, $R^2$ and $R^3$ independently represent a hydrogen atom, a halogen atom, or an alkyl group having from 1 to 6 carbon atoms. It is preferable that $R^1$, $R^2$ and $R^3$ independently represents a hydrogen atom or an alkyl group having from 1 to 6 carbon atoms, still preferably a hydrogen atom or an alkyl group having from 1 to 3 carbon atoms, and most desirably a hydrogen atom or a methyl group. It is particularly preferable that $R^2$ and $R^3$ are hydrogen atoms.

In the formula (I), X represents an oxygen atom (—O—) or imino (—NH—). It is still preferable that X is an oxygen atom.

In the formula (I), L represents a divalent linking group.

It is preferable that L is a divalent aliphatic group (an alkylene group, a substituted alkylene group, an alkenylene group, a substituted alkenylene group, an alkynylene group or a substituted alkynylene group), a divalent aromatic group (an arylene group or a substituted arylene group) or a divalent heterocyclic group, or a combination of such a group with an oxygen atom (—O—), a sulfur atom (—S—), imino (—NH—), substituted imino (—NR—, wherein R represents an aliphatic group, an aromatic group or a heterocyclic group) or carbonyl (—C—).

An aliphatic group may have a cyclic structure or a branched structure. An aliphatic group preferably has from 1 to 20 carbon atoms, still preferably from 1 to 15 and most desirably from 1 to 10. A saturated aliphatic group is preferred to an unsaturated aliphatic group. The aliphatic group may have a substituent and examples of the substituent include halogen atoms, hydroxyl, aromatic groups and heterocyclic groups.

An aromatic group preferably has from 6 to 20 carbon atoms, still preferably form 6 to 15 and most desirably form 6 to 10. The aromatic group may have a substituent and examples of the substituent include halogen atoms, hydroxyl, aliphatic groups, aromatic groups and heterocyclic groups.

A heterocyclic group preferably has a 5-membered ring or a 6-membered ring as the heterocycle. In addition to the heterocycle, it may have another heterocycle, an aliphatic ring or an aromatic ring fused thereto. The heterocyclic group may have a substituent and examples of the substituent include halogen atoms, hydroxyl, oxo (═O), thio (═S), imino (═NH), substituted imino (═NR—, wherein R represents an aliphatic group, an aromatic group or a heterocyclic group), aliphatic groups, aromatic groups and heterocyclic groups.

It is preferable that L is a divalent linking group containing a plural number of polyoxyalkylene structures. It is still preferable that the polyoxyalkylene structures are polyoxyethylene structures. In other words, it is preferable that L contains —(OCH$_2$CH$_2$)$_n$— (wherein n is an integer of 2 or more).

In the formula (I), Z represents a functional group adsorbing to the hydrophilic support surface (the adsorptive group to the hydrophilic support).

In the formula (I), B1 represents a protecting group of the adsorptive group removable by heat, an acid or a radical.
The adsorptive (functional) group and the protecting group thereof are as discussed above.
Now, examples of compounds having an ethylenically unsaturated bond and forming an adsorptive group to the hydrophilic support surface will be presented.
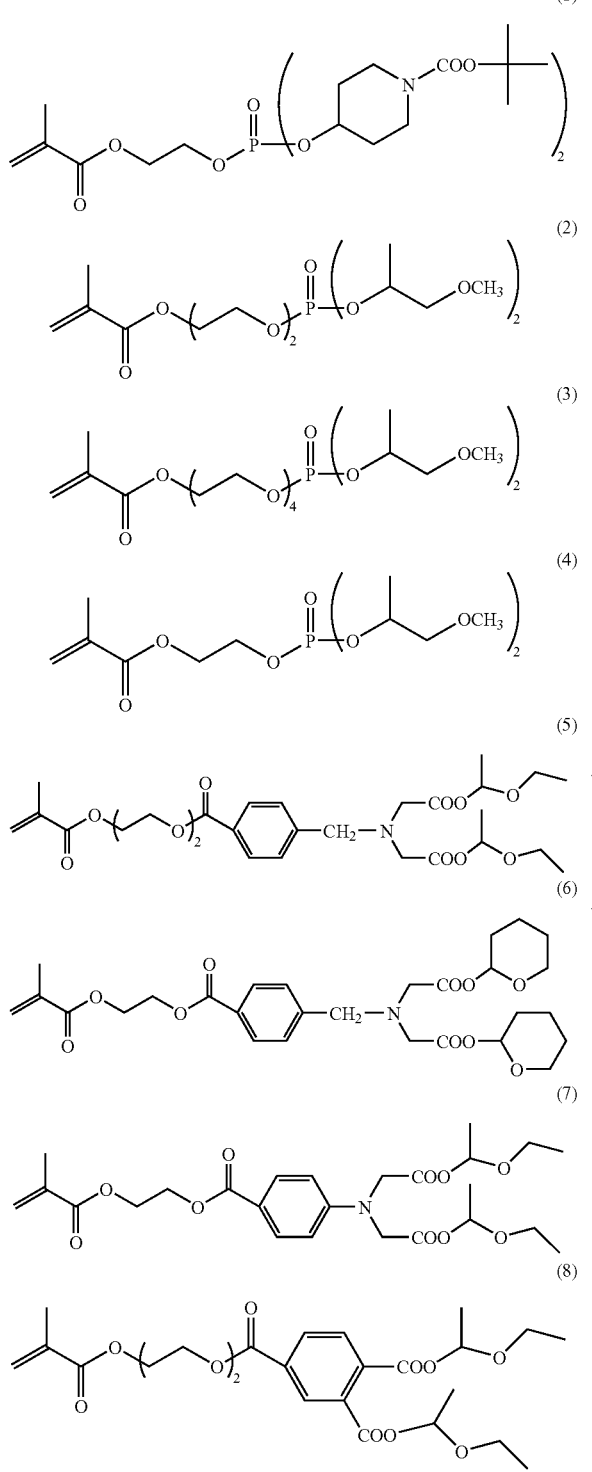
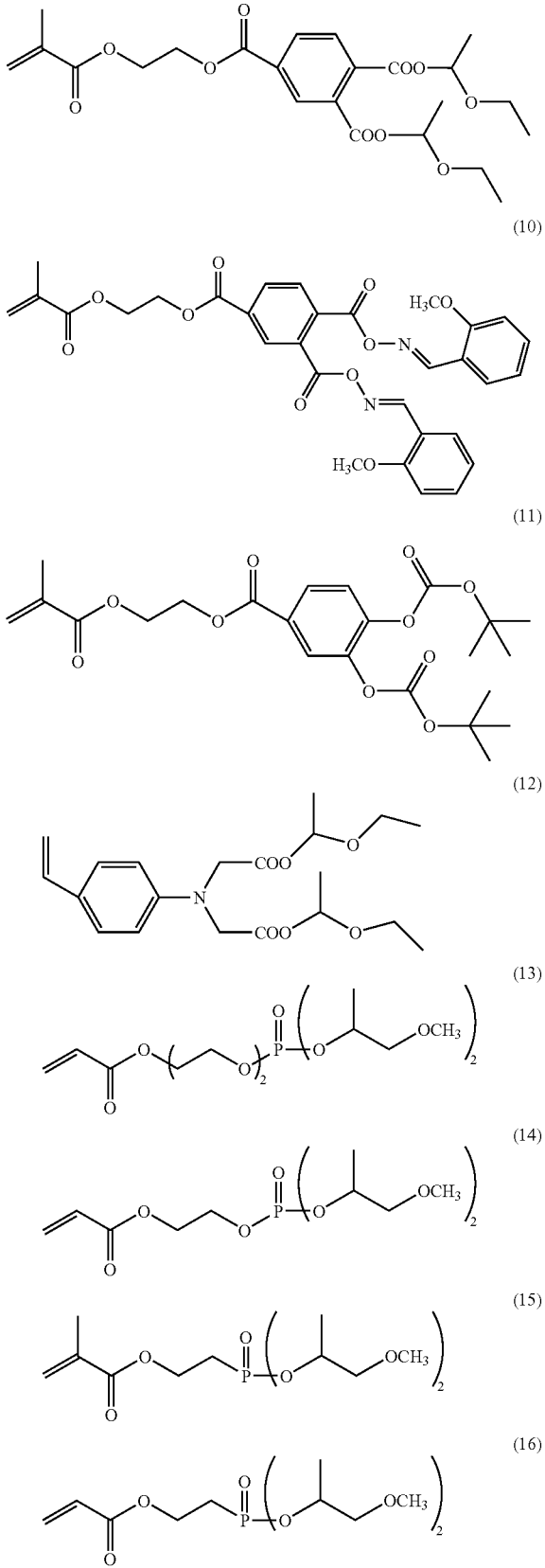

-continued

(17)
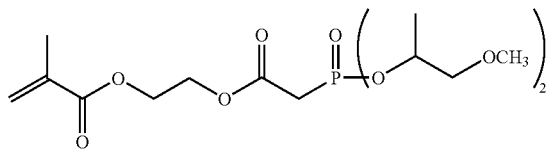

(18)
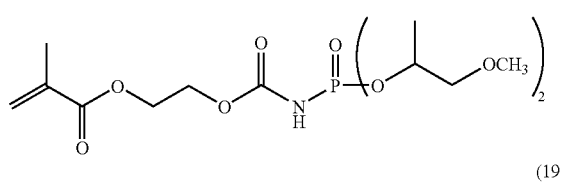

(19)
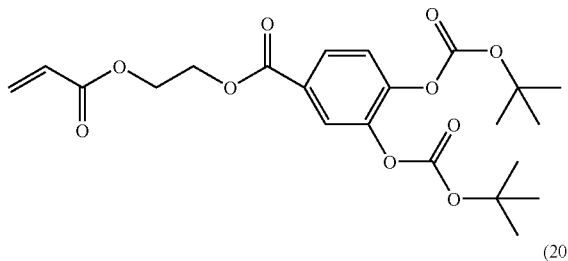

(20)
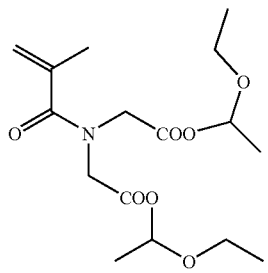

The compound forming an adsorptive group to the hydrophilic support surface may be a polymer. It is preferable that such a polymer forming an adsorptive group to the hydrophilic support surface has an ethylenically unsaturated bond. It is also preferable that the adsorptive group is formed in a side chain of the polymer. In other words, it is preferable that the functional group serving as a precursor of the adsorptive group is contained in the side chain of the polymer.

The main chain of the polymer is preferably a polyolefin.

It is preferable that the polymer forming an adsorptive group to the hydrophilic support surface contains a repeating unit represented by the following formula (II).

(II)
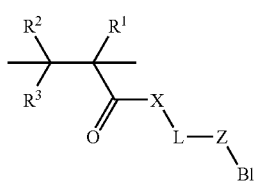

In the formula (II), $R^1$, $R^2$ and $R^3$ independently represent a hydrogen atom, a halogen atom, or an alkyl group having from 1 to 6 carbon atoms. The definition and examples of each group are the same as mentioned above with respect to the formula (I).

In the formula (II), X represents an oxygen atom (—O—) or imino (—NH—). It is still preferable that X is an oxygen atom.

In the formula (II), L represents a divalent linking group. The definition and examples of the divalent linking group are the same as mentioned above with respect to the formula (I).

In the formula (II), Z represents a functional group adsorbing to the hydrophilic support surface.

In the formula (II), B1 represents a protecting group of the adsorptive group removable by heat, an acid or a radical.

The functional group of the adsorptive group and the protecting group thereof are the same as described above.

It is preferable that the polymer is a copolymer comprising a repeating unit forming an adsorptive group to the hydrophilic support surface with another repeating unit. The other repeating unit may have an ethylenically unsaturated bond.

Now, examples of polymers forming an adsorptive group to the hydrophilic support surface will be presented.

(P-1)
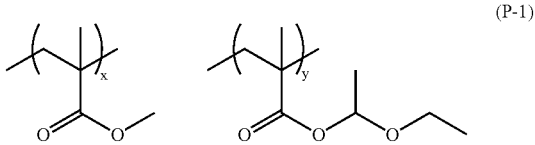

(P-2)
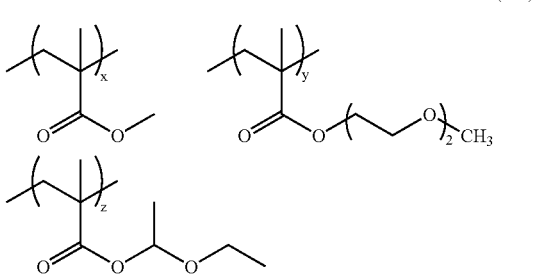

(P-3)
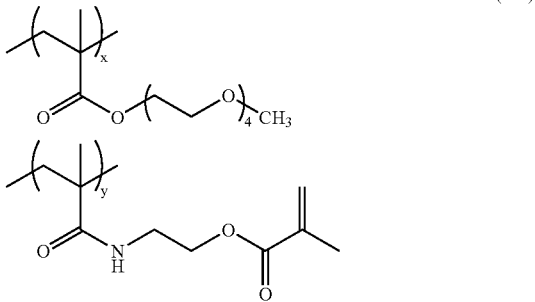

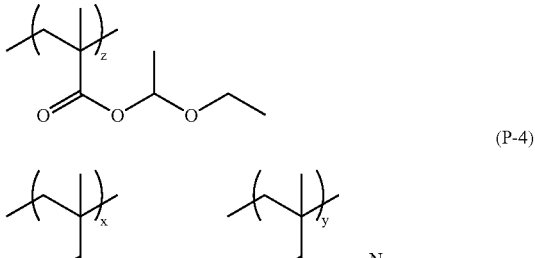

(P-4)
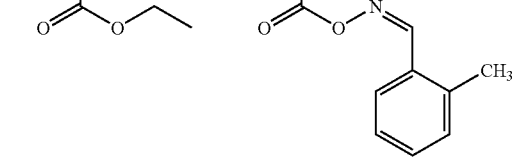

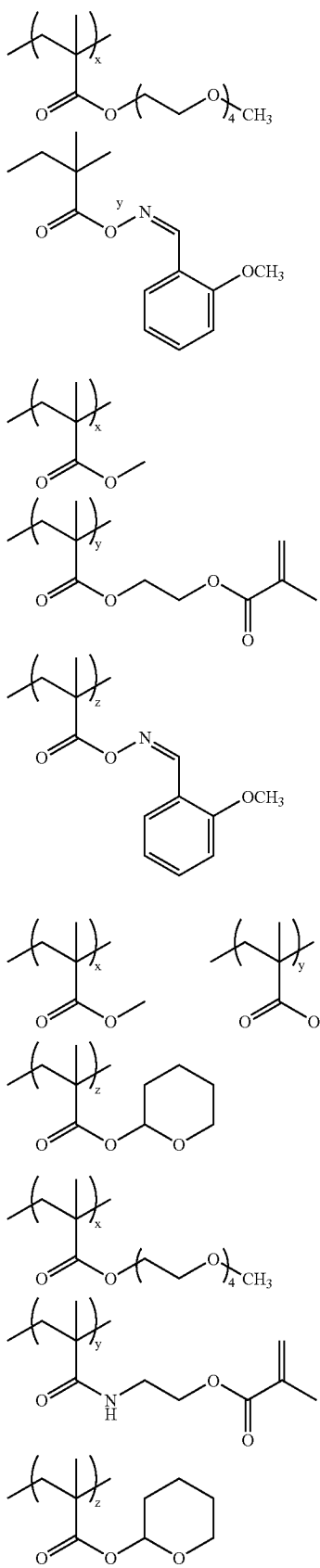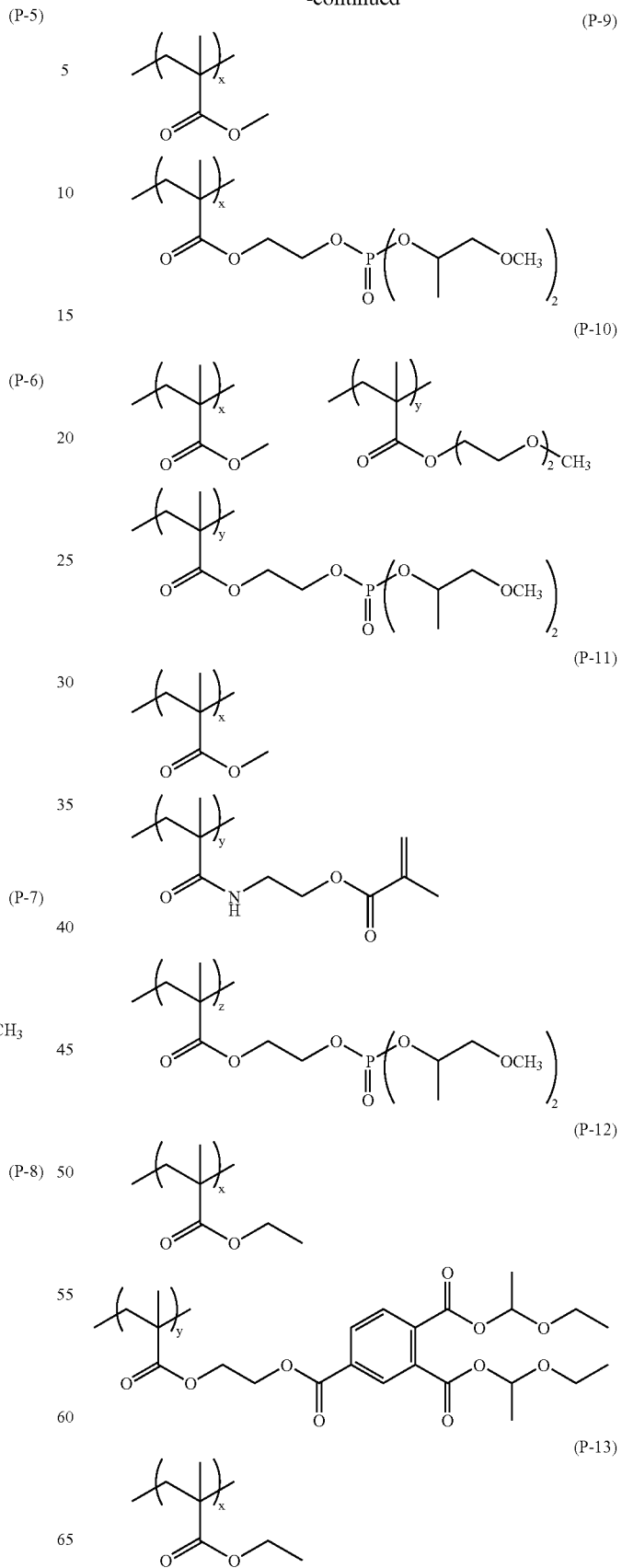

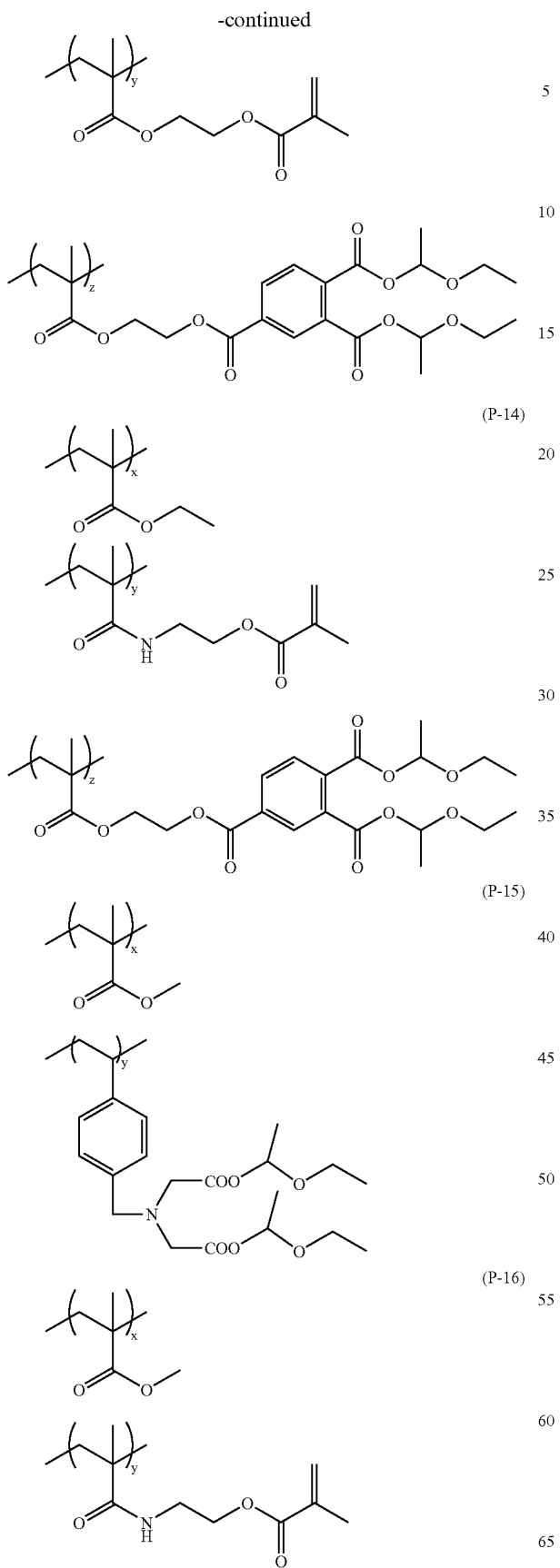
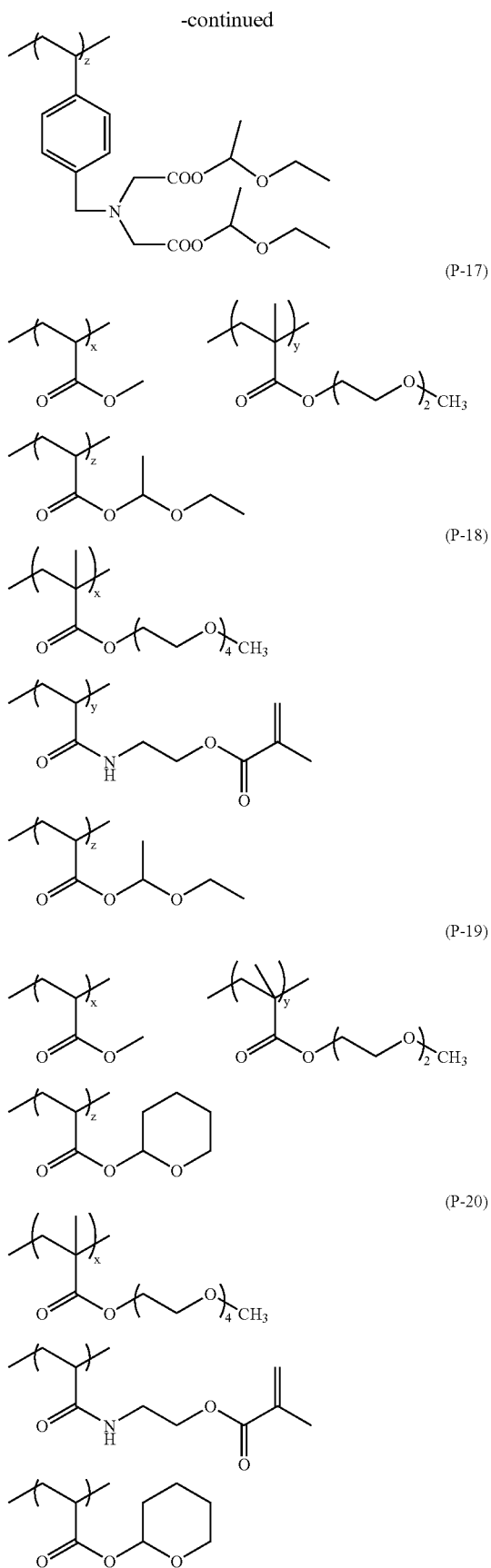

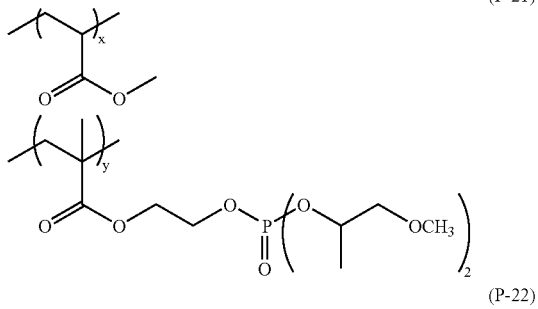
(P-21)

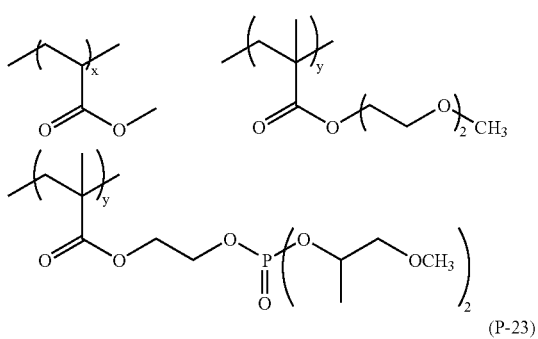
(P-22)

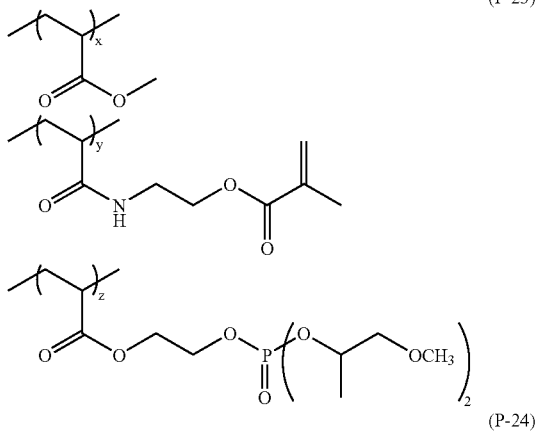
(P-23)

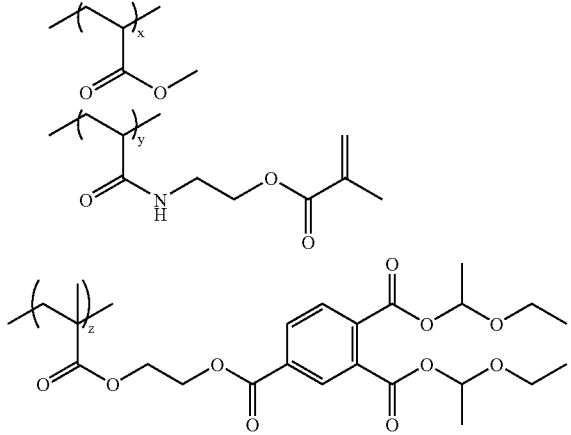
(P-24)

Use may be also made of two or more compounds forming an adsorptive group to the hydrophilic support surface together.

In the lithographic printing plate precursor, the image recording layer or a layer provided between the image recording layer and the hydrophilic support contains a compound forming an adsorptive group to the hydrophilic support surface. It is preferable that the layer provided between the image recording layer and the hydrophilic support is an undercoat layer.

In the case of adding the compound forming an adsorptive group to the hydrophilic support surface to the image forming g layer, the addition level preferably ranges from 0.1 to 50% by mass (% by weight). It is preferable to use the compounds 1 to 20 as cited above in an amount of from 0.01 to 100% by mass, still preferably from 0.1 to 50% by mass, based on the polymerizable compound.

In the case of adding the compound forming an adsorptive group to the hydrophilic support surface to the undercoat layer, the addition level preferably ranges from 0.1 to 100 mg/m$^2$, still preferably from 1 to 50 mg/m$^2$ and most desirably from 5 to 30 mg/m$^2$.

[Sensitizing Dye]

A sensitizing dye has a function of controlling the photosensitive wavelength range of the polymerization initiator. As the sensitizing dye, cyanine dyes, merocyanine dyes, arylidene dyes, xanthene dyes, ketocoumarin dyes and benzopyran dyes are preferred.

A cyanine dye is defined by the following formula.

$$Bs = Lo-Bo$$

In this formula, Bs represents a basic nucleus; Bo represents an onium moiety of a basic nucleus; and Lo represents a methine chain consisting of an odd number of methine groups.

A merocyanine dye is defined by the following formula.

$$Bs=Le=Ak$$

In this formula, Bs represents a basic nucleus; Ak represents an acidic nucleus of the keto type; and Le represents a methine chain consisting of an even number of methine groups.

To absorb short wavelength light such as ultraviolet light, a short methine chain (i.e., dimethine or zero methine) is favorable.

An arylidene dye is defined by the following formula.

$$Ar-Lo=Ak$$

In this formula, Ar represents an aromatic nucleus; Ak represents an acidic nucleus of the keto type; and Lo represents a methine chain consisting of an odd number of methine groups.

A xanthene dye is a compound having a xanthene ring.

A ketocoumarin dye is a compound having a 2-keto coumarin ring. It is preferable that an alkyl-substituted amino group is attached to the 7-position of the coumarin ring. The alkyl group in the alkyl-substituted amino group may be bonded to the coumarin ring to form a fused heterocycle.

A benzopyran dye is a compound having a 1,2-benzopyran ring, a 1,2-benzothiopyran ring or a 1,2-dihydroquinoline ring. It is preferable that a methylene group (=CR2) is attached to the 2-position of the 1,2-benzopyran ring, 1,2-benzothiopyran ring or 1,2-dihydroquinoline ring, wherein R represents a hydrogen atom, a cyano group, an alkoxycarbonyl group, an aryloxycarbonyl group, an acyl group, an alkylthio group, an arylthio group, an alkylsulfonyl group, an arylsulfonyl group or a fluorosulfonyl group.

The image recording layer may further containing an sensitizing aid. As the sensitizing aid, a hydrogen-donating compound is preferable. As the hydrogen-donating compound, a thiol (for example, 2-mercaptobenzthiazole, 2-mercaptobenzimidazole or 2-mercaptobenzoxazole) or an amine (for example, N-phenylglcyine or an N,N-dialkylamino aromatic alkyl ester) is preferred.

[Infrared Absorbing Agent]

To ensure efficient image formation with the use of a laser emitting infrared rays of 760 nm to 1200 nm in wavelength as the light source, the lithographic printing plate precursor should contain an infrared absorbing agent. The infrared absorbing agent has a function of converting infrared rays absorbed by it into heat. Owing to the heat thus generated, a polymerization initiator (a radical generator) as will be described hereinafter is thermally decomposed and emits radicals. The infrared absorbing agent is a dye or a pigment having an absorption maximum at 760 to 1200 nm.

As the dye, use can be made of commercially available dyes and publicly known ones described in documents, for example, Senryo Binran (ed. by The Society of Synthetic Organic Chemistry, Japan, 1970), etc. Specific examples thereof include azo dyes, metal complex salt azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrilium salts, metal thiolate complexes, oxonol dyes, diimonium dyes, aminium dyes, croconium dyes and so on.

Examples of preferable dyes include cyanine dyes described in JP-A-58-125246, JP-A-59-84356, JP-A-60-78787, etc., methine dyes described in JP-A-58-173696, JP-A-58-181690, JP-A-58-194595, etc., naphthoquinone dyes described in JP-A-58-112793, JP-A-58-224793, JP-A-59-48187, JP-A-59-73996, JP-A-60-52940, JP-A-60-63744, etc., squarylium dyes described in JP-A-58-112792, etc., cyanine dyes described in British Patent 434,875, and so on.

Further, it is appropriate to use a near infrared absorbing sensitizer described in U.S. Pat. No. 5,156,938. Furthermore, use can be preferably made of substituted arylbenzo(thio)pyrilium salts described in U.S. Pat. No. 3,881,924, trimethine thiapyrilium salts described in JP-A-57-142645 (U.S. Pat. No. 4,327,169), pyrilium compounds described in JP-A-58-181051, JP-A-58-220143, JP-A-59-41363, JP-A-59-84248, JP-A-59-84249, JP-A-59-146063 and JP-A-59-146061, cyanine dyes described in JP-A-59-216146, pentamethine thiopyrilium salts described in U.S. Pat. No. 4,283,475 and pyrilium compounds described in JP-B-5-13514 and JP-B-5-19702. As preferable examples of the dye, it is also possible to cite near infrared absorbing dyes represented by formulae (I) and (II) in U.S. Pat. No. 4,756,993.

As another preferable example of the infrared absorbing agent according to the present invention, specific indolenine cyanine dyes described in Japanese Patent Application 2001-6326 and Japanese Patent Application 2001-237840 can be cited.

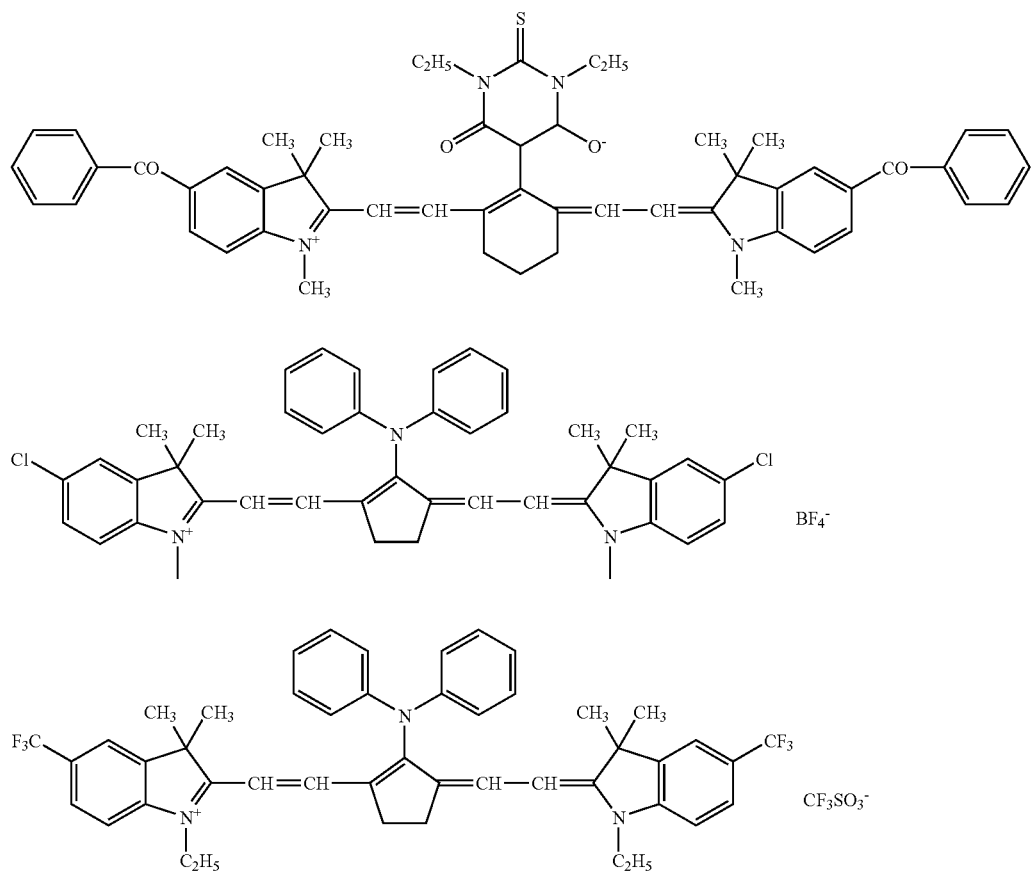

Among these dyes, particularly preferable examples include cyanine dyes, squarylium dyes, pyrilium salts, nickel thiolate complexes and the indolenine cyanine dyes. The cyanine dyes and the indolenine cyanine dyes are still preferable. In particular, cyanine dyes represented by the following formula (i) may be cited as highly desirable examples.

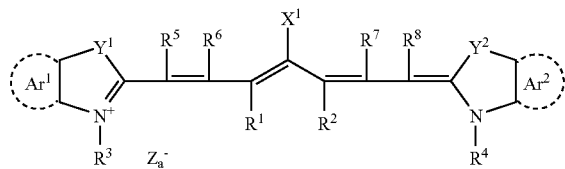

In the formula (i), $X^1$ represents a hydrogen atom, a halogen atom, —$NPh_2$, $X^2$-$L^1$ or the following group, wherein $X^2$ represents an oxygen atom, a nitrogen atom or a sulfur atom; while $L^1$ represents a hydrocarbon group having 1 to 12 carbon atoms, an aromatic ring having a hetero atom or a hydrocarbon group containing a hetero atom and having 1 to 12 carbon atoms. The term hetero atom as used herein means, N, S, O, a halogen atom or Se. $Xa^-$ has the same meaning as will be defined with respect to $Za^-$. $R^a$ represents a substituent selected from among a hydrogen atom, an alkyl group, an aryl group, a substituted or unsubstituted amino group and a halogen atom.

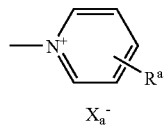

$R^1$ and $R^2$ independently represent each a hydrocarbon group having 1 to 12 carbon atoms. Taking the storage stability of a coating solution for recording layer into consideration, it is preferable that $R^1$ and $R^2$ are each a hydrocarbon group having 2 or more carbon atoms. It is still preferable that $R^1$ and $R^2$ are bonded to each other to form a 5-membered ring or a 6-memebred ring.

$Ar^1$ and $Ar^2$ may be either the same or different and each represents an optionally substituted aromatic hydrocarbon group. Preferable examples of the aromatic hydrocarbon group include a benzene ring and a naphthalene ring. Preferable examples of the substituent include hydrocarbon groups having 12 or less carbon atoms, halogen atoms and alkoxy groups having 12 or less carbon atoms. $Y^1$ and $Y^2$ may be either the same or different and each represents a sulfur atom or a dialkylmethylene group having 12 or less carbon atoms. $R^3$ and $R^4$ may be either the same or different and each represents an optionally substituted hydrocarbon group having 20 or less carbon atoms. Preferable examples of the substituent include alkoxy groups having 12 or less carbon atoms, a carboxyl group and a sulfo group. $R^5$, $R^6$, $R^7$ and $R^8$ may be either the same or different and each represents a hydrogen atom or a hydrocarbon group having 12 or less carbon atoms. From the viewpoint of the availability of starting materials, a hydrogen atom is favorable. $Za^-$ represents a counter anion. However, $Za^-$ is unnecessary in the case where the cyanine dye represented by the formula (i) has an anionic substituent in its structure and thus the neutralization of the charge is unnecessary. From the viewpoint of the storage stability of a coating solution for recording layer, preferable examples of $Za^-$ include a halogen ion, a perchlorate ion, a tetrafluoroborate ion, a hexafluorophosphate ion and a sulfonate ion. In particular, a perchlorate ion, a hexafluorophosphate ion and an arylsulfonate ion are preferable therefor.

Specific examples of the cyanine dyes represented by the formula (i) which are appropriately usable in the invention include those described in paragraphs [0017] to [0019] in JP-A-2001-133969.

As a still preferable example thereof, a specific indolenine cyanine dyes described in Japanese Patent Application 2001-6326 and Japanese Patent Application 2001-237840, which are described above, may be cited.

As examples of the pigment to be used in the invention, commercially available pigments and pigments described in *Color Index* (C.I.) *Binran, Saishin Ganryo Binran* (ed. by Nippon Ganryo Gijutsu Kyokai, 1977), *Saishin Ganryo Oyo Gijutsu* (CMC Shuppan, 1986) and *Insatsu Inki Gijutsu* (CMC Shuppan, 1984) may be cited.

Concerning the types of the pigments, use can be made of black pigments, yellow pigments, orange pigments, brown pigments, red pigments, purple pigments, blue pigments, green pigments, fluorescent pigments, metallic powder pigments, and polymer-binding pigments. More specifically speaking, use can be made of insoluble azo pigments, azo lake pigments, condensed azo pigments, chelate azo pigments, phthalocyanine-type pigments, anthraquinone-type pigments, perylene and perynone-type pigments, thioindigo-type pigments, quinacridone-type pigments, dioxazine-type pigments, isoindolinone-type pigments, quinophthalone-type pigments, underglaze lake pigments, azine pigments, nitroso pigments, nitro pigments, natural pigments, fluorescent pigments, inorganic pigments, carbon black and so on. Among these pigments, carbon black is preferred.

Such a pigment may be used without any surface treatment. Alternatively, it may be surface-treated before using. As the surface-treatment method, a method of coating the surface with a resin or a wax, a method of attaching a surfactant, a method of bonding a reactive substance (for example, a silane coupling agent, an epoxy compound, a polyisocyanate or the like) to the surface of the pigment, etc. may be suggested. These surface-treatment methods are reported by *Kinzoku Sekken no Seishitu to Oyo* (Saiwai Shobo), *Insatsu Inki Gijutsu* (CMC Shuppan, 1984) and *Saishin Ganryo Oyo Gijutsu* (CMC Shuppan, 1986).

The particle diameter of the pigment preferably ranges from 0.01 to 10 μm, still preferably from 0.05 to 1 μm and particularly preferably from 0.1 to 1 μm. So long as the particle diameter falls within this range, a high stability of the pigment dispersion in a coating solution of image recording layer and a favorable uniformity of the image recording layer can be achieved.

To disperse the pigment, use can be made of a publicly known dispersion technique having been employed in producing inks, toners, etc. Examples of a dispersing machine include an ultrasonic disperser, a sand mill, an attritor, a pearl mill, a super mill, a ball mill, an impeller, a disperser, a KD mill, a colloid mill, a dynatron, a three-roll mill, a pressure kneader and so on. Details are described in *Saishin Ganryo Oyo Gijutsu* (CMC Shuppan, 1986).

Such an infrared absorbing agent may be added together with other components to a single layer. Alternatively, the infrared absorbing agent may be added to a layer which is separately formed. The infrared absorbing agent is added so that, in constructing a negative lithographic printing plate precursor, the image recording layer shows an absorbance of from 0.1 to 1.5 (measured by the reflection method), preferably from 0.2 to 1.2, at the maximum absorption wavelength within a wavelength range of from 760 nm to 1200 nm. So long as the absorbance falls within this range, polymerization uniformly proceeds in the depth direction of the image recording layer and thus a favorable film strength in an image part and an excellent adhesion to the support can be established.

The absorbance of the image recording layer can be controlled depending on the amount of the infrared absorbing agent to be added to the image recording layer and the thickness of the image recording layer. The absorbance can be measured by a common method. Examples of the measurement method include a method which comprises forming an image recording layer having a thickness, which is appropriately determined within a range required as a lithographic printing plate precursor by considering the coating amount after drying, on a reflective support (aluminum, etc.) and then measuring the reflection density with an optical densitometer, a method of measuring the reflection by the reflection method with the use of an integral sphere by using a spectrophotometer, etc.

[Polymerization Generator]

A polymerization generator means a compound which generates radicals by heat or light energy or both thereof and thus initiates and promotes the polymerization of a compound having a polymerizable unsaturated bond. As the polymerization generator usable in the invention, use may be made of publicly known thermal polymerization initiators, compounds having a bond with a low unbound energy, photopolymerization initiators and so on. The radical-generating compound appropriately usable in the invention means a compound which generates radicals by heat energy and thus initiates and promotes the polymerization of a compound having a polymerizable unsaturated bond. As the radical-generating compound usable in the invention, use may be made of publicly known polymerization initiators, compounds having a bond with a low unbound energy and so on. Either one of such radical-generating compounds or a combination of two or more thereof may be used.

As examples of the radical-generating compound, organic halides, carbonyl compounds, organic peroxides, azo-type polymerization initiators, azide compounds, metallocene compounds, hexaaryl biimidazole compounds, organic boric acid compounds, disulfonic acid compounds, oxime ester compounds and onium salt compounds may be cited.

Specific examples of the above-described organic halides include compounds described in Wakabayashi et al., Bull. Chem. Soc. Japan, 42, 2924 (1969), U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243, JP-A-63-298339 and M. P. Hutt, Journal of Heterocyclic Chemistry, 1 (No.3), 1970. Among all, tirhalomethyl-substituted oxazole compounds:S-triazine compounds may be cited.

More appropriate examples thereof include S-triazine derivatives having at least one mono-, di- or tri-halomethyl group is attached to an S-triazine ring, such as 2,4,6-tris(monochloromethyl)-S-triazine, 2,4,6-tris(dichloromethyl)-S-triazine, 2,4,6-tris(trichloromethyl)-S-triazine, 2-methyl-2,6-bis(trichloromethyl)-S-triazine, 2-n-propyl-4,6-bis(trichloromethyl)-S-triazine, 2-(α,α,β-trichloroethyl)-4,6-bis(trichloromethyl)-S-triazine, 2-phenyl-4,6-bis(trichloromethyl)-S-triazine,2-(p-methoxyphenyl)-4,6-bis(trichloromethyl)-S-triazine, 2-(3,4-epoxyphenyl)-4,6-bis(trichloromethyl)-S-triazine,2-(p-chlorophenyl)-4,6-bis(trichloromethyl)-S-triazine,2-[1-(p-methoxyphenyl)-2,4-butadienyl]-4,6-bis(trichloromethyl)-S-triazine, 2-styryl-4,6-bis(trichloromethyl)-S-triazine,2-(p-methoxystyryl)-4,6-bis(trichloromethyl)-S-triazine, 2-(p-i-propyloxystyryl)-4,6-bis(trichloromethyl)-S-triazine, 2-(p-tolyl)-4,6-bis(trichloromethyl)-S-triazine, 2-(4-naphthoxynaphthyl)-4,6-bis(trichloromethyl)-S-triazine, 2-phenylthio-4,6-bis(trichloromethyl)-S-triazine, 2-benzylthio-4,6-bis(trichloromethyl)-S-triazine, 2,4,6-tris(dibromomethyl)-S-triazine, 2,4,6-tris(tribromomethyl)-S-triazine, 2-methyl-4,6-bis(tribromomethyl)-S-triazine and 2-methoxy-4,6-bis(tribromomethyl)-S-triazine.

Examples of the above-described carbonyl compounds include benzophenone and its derivatives such as Micheler's ketone, 2-methylbenzophenone, 3-methylbenzophenone, 4-methylbenzophenone, 2-chlorobenzophenone, 4-bromobenzophenone and 2-carboxybenzophenone, acetophenone derivatives such as 2,2-dimethoxy-2-phenylacetophenone, 2,2-diethoxyacetophenone, 1-hydroxycyclohexylphenylacetophenone, α-hydroxy-2-methylphenylpropanone, 1-hydroxy-1-methyl ethyl-(p-isopropylphenyl) ketone, 1-hydroxy-1-(p-dodecylphenyl) ketone, 2-methyl-(4'-(methylthio)phenyl)-2-morpholino-1-propanone and 1,1,1-trichloromethyl-(p-butylphenyl) ketone, thioxanthone and its derivatives such as 2-ethylthioxanthone, 2-isopropylthioxanthone, 2-chlorothioxanthone, 2,4-dimethylthioxanthone, 2,4-diethylthioxanthone and 2,4-diisopropylthioxanthone, and benzoic ester derivatives such as ethyl p-dimethylaminobenzoate and ethyl p-diethylaminobenzoate.

As the above-described azo compound, use may be made of, for example, azo compounds described in JP-A-8-108621 and so on.

Examples of the above-described organic peroxides include tirmethylcyclohexanone peroxide, acetyl acetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, succinic peroxide, benzoyl peroxide, 2,4-dichlorobenzoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl) peroxydicarbonate, tertiary-butyl peroxyacetate, tert-butyl peroxypivalate, tert-butyl peroxyneodecanoate, tert-butyl tertiary-butyl peroxyneodecanoate, tertiary-butyl peroxyoctanoate, tert-butyl peroxylaurate, tertiary-carbonate 3,3',4,4'-tetra-(t-butylperoxycarbonyl)benzophenone, 3,3',4,4'-tetra-(t-hexylperoxycarbonyl)benzophenone, 3,3',4,4'-tetra-(t-octylperoxycarbonyl) benzophenone, 3,3',4,4'-tetra-(p-isopropylcumylperoxycarbonyl)benzophenone, carbonyldi(t-butylperoxy dihydrogen diphthalate), carbonyldi(t-hexylperoxy dihydrogen diphthalate) and so on.

Examples of the above-described metallocene compounds include various titanocene compounds described in JP-A-59-152396, JP-A-61-151197, JP-A-63-41484, JP-A-2-249, JP-A-2-4705 and JP-A-5-83558, such as di(cyclopentadienyl)-Ti-bis-phenyl, di(cyclopentadienyl)-Ti-bis-2,6-difluorophen-1-yl, di(cyclopentadienyl)-Ti-bis-2,4-difluorophen-1-yl, di(cyclopentadienyl)-Ti-bis-2,4,6-trifluorophen-1-yl, di(cyclopentadienyl)-Ti-bis-2,3,5,6-tetrafluorophen-1-yl, di(cyclopentadienyl)-Ti-bis-2,3,4,5,6-pentafluorophen-1-yl, di(methylcyclopentadienyl)-Ti-bis-2,6-difluorophen-1-yl, di(methylcyclopentadienyl)-Ti-bis-2,4,6-trifluorophen-1-yl, di(methylcyclopentadienyl)-Ti-bis-2,3,5,6-tetrafluorophen- 1-yl, di(methylcyclopentadienyl)-Ti-bis-2,3,4,5,6-pentafluorophen-1-yl and iron-arene complexes described in JP-A-1-304453 and JP-A-1-152109.

Examples of the above-described hexaarylbiimidazole compounds include various compounds described in JP-B-6-29285, U.S. Pat. Nos. 3,479,185, 4,311,783and 4,622,286 such as 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitorophenyl)-4,4',5,5'-tetraphenylbiimidazole, 2,2'-bis(o-methylphenyl)-4,4',5,5'-tetraphenylbiimidazole and 2,2'-bis(o-trifluorophenyl)-4,4',5,5'-tetraphenylbiimidazole.

Examples of the above-described organic borate compounds include organic borates described in JP-A-62-143044, JP-A-62-150242, JP-A-9-188685, JP-A-9-188686, JP-A-9-188710, JP-A-2000-131837, JP-A-2002-107916, Japanese Patent No.2764769, Japanese Patent Application 2000-31080, Kunz, Martin, Rad Tech'98, Proceeding Apr. 19-22, 1998, Chicago, and so on, organic boron sulfonium complexes or organic boron oxosulfonium complexes described in JP-A-6-157623, JP-A-6-175564 and JP-A-6-175561, organic boron iodonium complexes described in JP-A-6-175554 and JP-A-6-175553, organic boron phosphonium complexes described in JP-A-9-188710, and organic boron transition metal-coordinate complexes described in JP-A-6-348011, JP-A-7-128785, JP-A-7-140589, JP-A-7-306527 and JP-A-7-292014.

Examples of the above-described disulfone compounds include compounds described in JP-A-61-166544 and Japanese Patent Application 2001-132318.

The above-described oxime compounds are described in J.C.S. Perkin II (1979) 1653-1660, J.C.S. Perkin II (1979) 156-162, Journal of Photopolymer Science and Technology (1995) 202-232, JP-A-2000-66385 and JP-A-2000-80068. In addition, the following compounds may be cited.

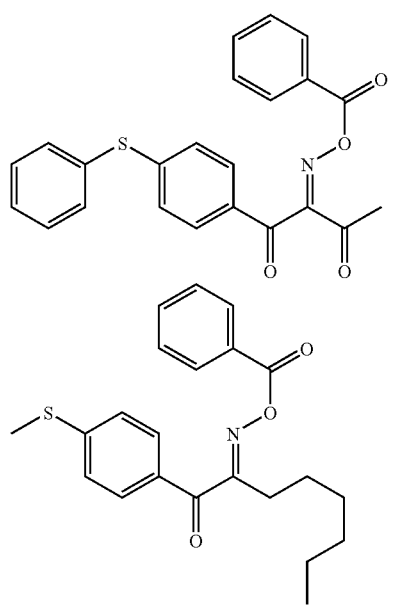

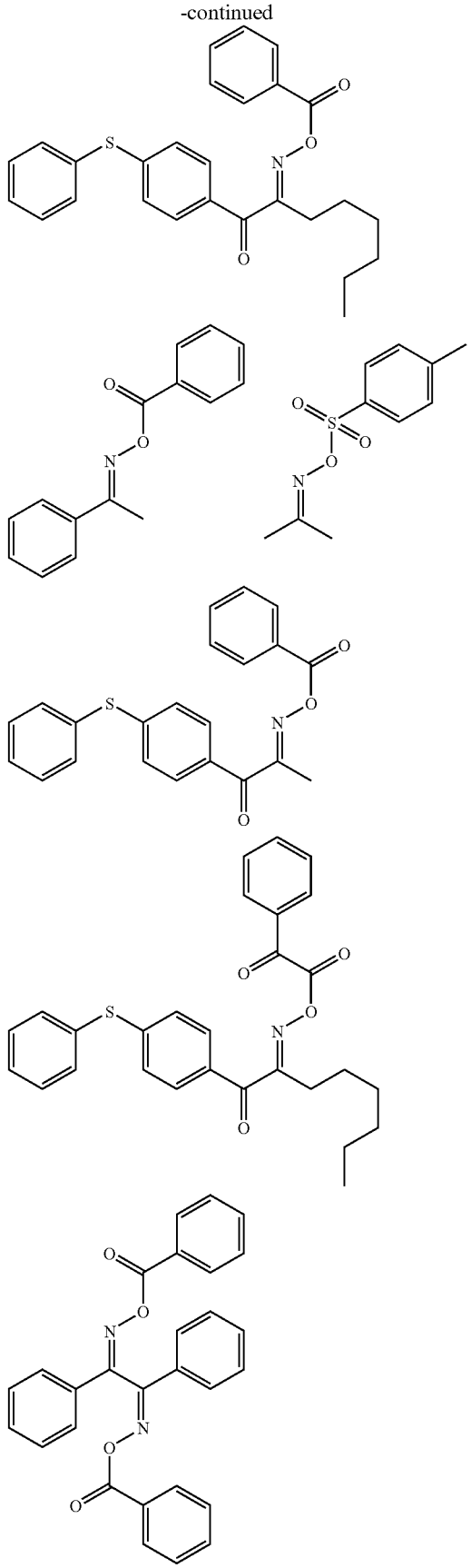

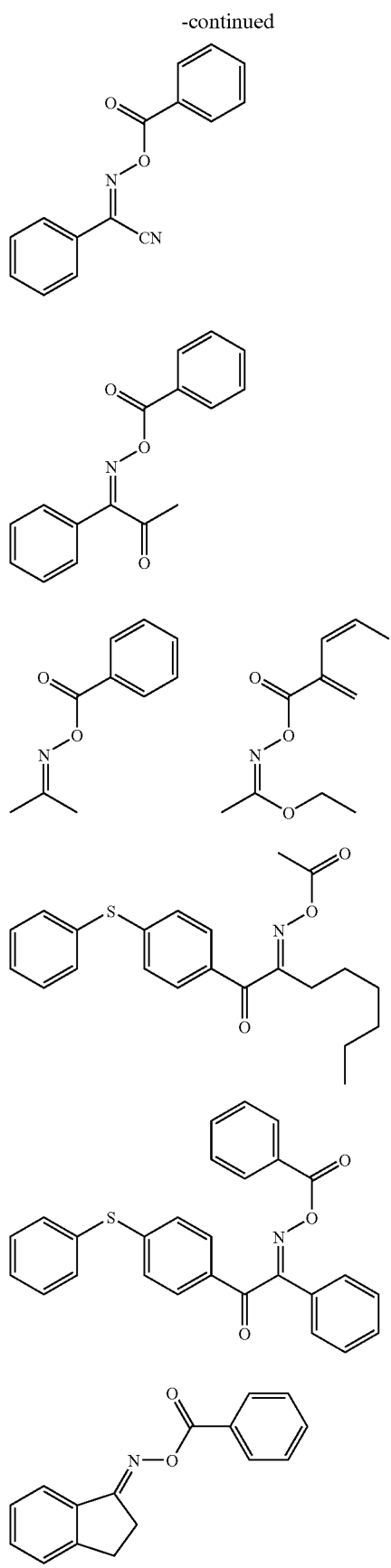
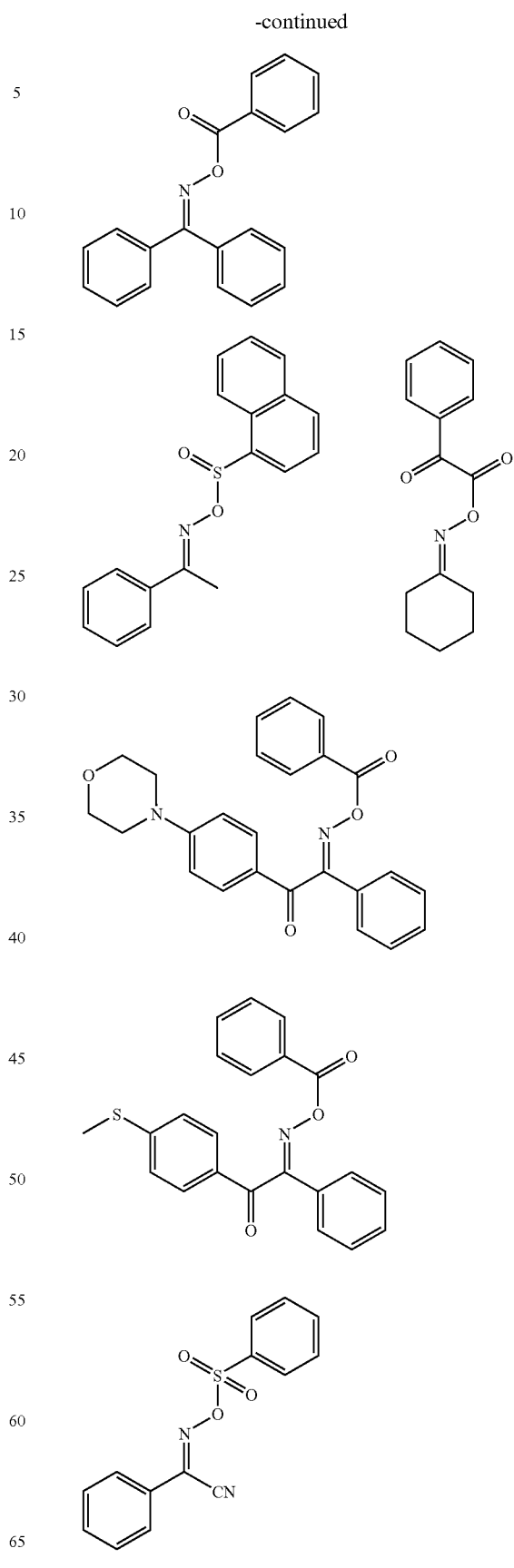

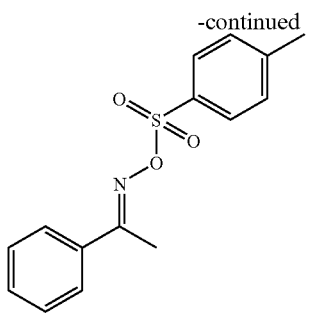

Examples of the above-described onium salt compounds include diazonium salts described in S. I. Schelesinger, Photogr. Sci. Eng., 18, 387 (1974) and T. S. Bal et al., Polymer, 21, 423 (1980), ammonium salts described in U.S. Pat. No. 4,069,055, JP-A-4-365049 and so on, phosphonium salts described in U.S. Pat. Nos. 4,069,055 and 4,069,056, iodonium salts described in European Patent 104,143, U.S. Pat. Nos. 339,049, 410,201, JP-A-2-150848 and JP-A-2-296514, sulfonium salts described in European Patent 370,693, European Patent 390,214, European Patent 233,567, European Patent 297,443, European Patent 297,442, U.S. Pat. Nos. 4,933,377, 161,811, 410,201, 339,049, 4,760,013, 4,734,444, 2,833,827, German Patent 2,904,626, German Patent 3,604,580 and German Patent 3,604,581, selenonium salts described in J. V. Crivello et al., Macromolecules, 10(6), 1307 (1977) and J. V. Crivello et al., J. Polymer Sci., Polymer Chem. Ed., 17, 1047 (1979), arsonium salts described in C. S. Wen et al., Teh, Proc. Conf. Rad. Curing ASIA, p. 478, Tokyo, October (1988) and so on.

From the viewpoints of reactivity and stability, use may be particularly made of the above-described oxime ester compounds, diazonium salts, iodonium salts and sulfonium salts. In the invention, such an onium salt serves not as an acid generator but as an ionic radical generator.

Onium salts represented by the following formulae (RI-I) to (RI-III) are particularly preferably employed in the invention.

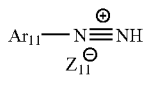 (RI-I)

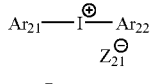 (RI-II)

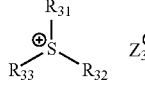 (RI-III)

In the formula (RI-I), $Ar_{11}$ represents an aryl group having not more than 20 carbon atoms and optionally having from 1 to 6 substituents. Preferable examples of the substituent include alkyl groups having from 1 to 12 carbon atoms, alkenyl groups having from 1 to 12 carbon atoms, alkynyl groups having from 1 to 12 carbon atoms, aryl groups having from 1 to 12 carbon atoms, alkoxy groups having from 1 to 12 carbon atoms, aryloxy groups having from 1 to 12 carbon atoms, halogen atoms, alkylamino groups having from 1 to 12 carbon atoms, dialkylamino groups having from 1 to 12 carbon atoms, alkylamido groups or arylamido groups having from 1 to 12 carbon atoms, a carbonyl group, a carboxyl group, a cyano group, a sulfonyl group, thioalkyl groups having from 1 to 12 carbon atoms and thioaryl groups having from 1 to 12 carbon atoms. $Z_{11}^-$ represents a monovalent anion selected from the group consisting of halogen ions, a perchlorate ion, a hexafluorophosphate ion, a tetrafluoroborate ion, a sulfonate ion, a sulfinate ion, a thiosulfonate ion and sulfate ion. From the viewpoint of stability, it preferably represents a perchlorate ion, a hexafluorophosphate ion, a tetrafluoroborate ion, a sulfonate ion or a sulfinate ion.

In the formula (RI-II), $Ar_{21}$ and $Ar_{22}$ independently represent each an aryl group having not more than 20 carbon atoms and optionally having from 1 to 6 substituents. Preferable examples of the substituent include alkyl groups having from 1 to 12 carbon atoms, alkenyl groups having from 1 to 12 carbon atoms, alkynyl groups having from 1 to 12 carbon atoms, aryl groups having from 1 to 12 carbon atoms, alkoxy groups having from 1 to 12 carbon atoms, aryloxy groups having from 1 to 12 carbon atoms, halogen atoms, alkylamino groups having from 1 to 12 carbon atoms, dialkylamino groups having from 1 to 12 carbon atoms, alkylamido groups or arylamido groups having from 1 to 12 carbon atoms, a carbonyl group, a carboxyl group, a cyano group, a sulfonyl group, thioalkyl groups having from 1 to 12 carbon atoms and thioaryl groups having from 1 to 12 carbon atoms. $Z_{21}^-$ represents a monovalent anion selected from the group consisting of halogen ions, a perchlorate ion, a hexafluorophosphate ion, a tetrafluoroborate ion, a sulfonate ion, a sulfinate ion, a thiosulfonate ion and sulfate ion. From the viewpoints of stability and reactivity, it preferably represents a perchlorate ion, a hexafluorophosphate ion, a tetrafluoroborate ion, a sulfonate ion, a sulfinate ion or a carboxylate ion.

In the formula (RI-III), $R_{31}$, $R_{32}$ and $R_{33}$ independently represent each an aryl group, an alkyl group, an alkenyl group or an alkynyl group having not more than 20 carbon atoms and optionally having from 1 to 6 substituents. Preferable examples of the substituent include alkyl groups having from 1 to 12 carbon atoms, alkenyl groups having from 1 to 12 carbon atoms, alkynyl groups having from 1 to 12 carbon atoms, aryl groups having from 1 to 12 carbon atoms, alkoxy groups having from 1 to 12 carbon atoms, aryloxy groups having from 1 to 12 carbon atoms, halogen atoms, alkylamino groups having from 1 to 12 carbon atoms, dialkylamino groups having from 1 to 12 carbon atoms, alkylamido groups or arylamido groups having from 1 to 12 carbon atoms, a carbonyl group, a carboxyl group, a cyano group, a sulfonyl group, thioalkyl groups having from 1 to 12 carbon atoms and thioaryl groups having from 1 to 12 carbon atoms. $Z_{31}^-$ represents a monovalent anion selected from the group consisting of halogen ions, a perchlorate ion, a hexafluorophosphate ion, a tetrafluoroborate ion, a sulfonate ion, a sulfinate ion, a thiosulfonate ion and sulfate ion. From the viewpoints of stability and reactivity, it preferably represents a perchlorate ion, a hexafluorophosphate ion, a tetrafluoroborate ion, a sulfonate ion, a sulfinate ion or a carboxylate ion. In particular, a carboxylate ion described in Japanese Patent Application 2000-160323 is preferable and a carboxylate ion described in Japanese Patent Application 2001-177150 and Japanese Patent Application 2000-266797 is still preferable.

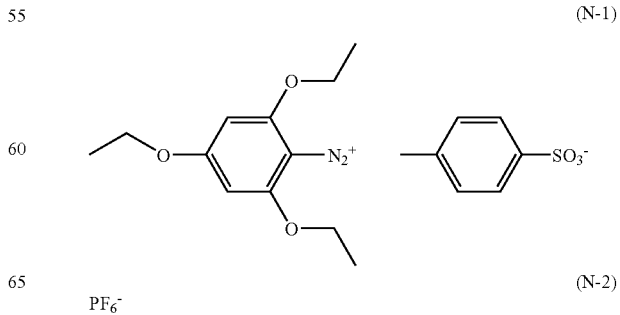

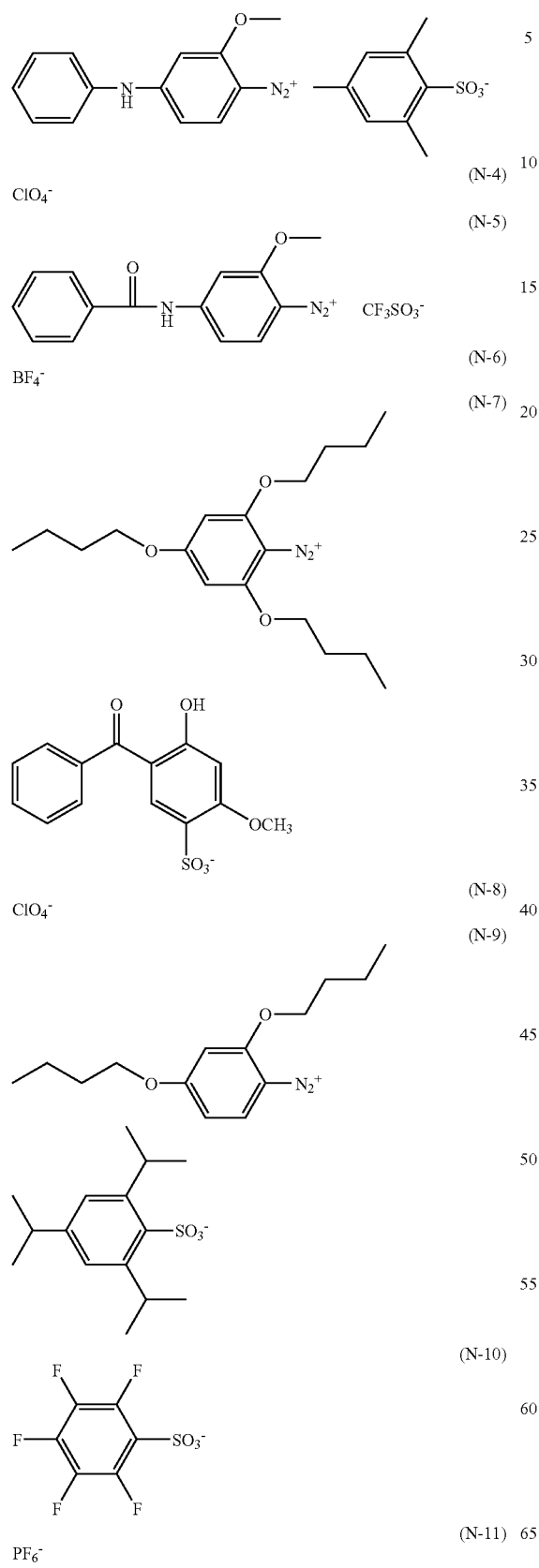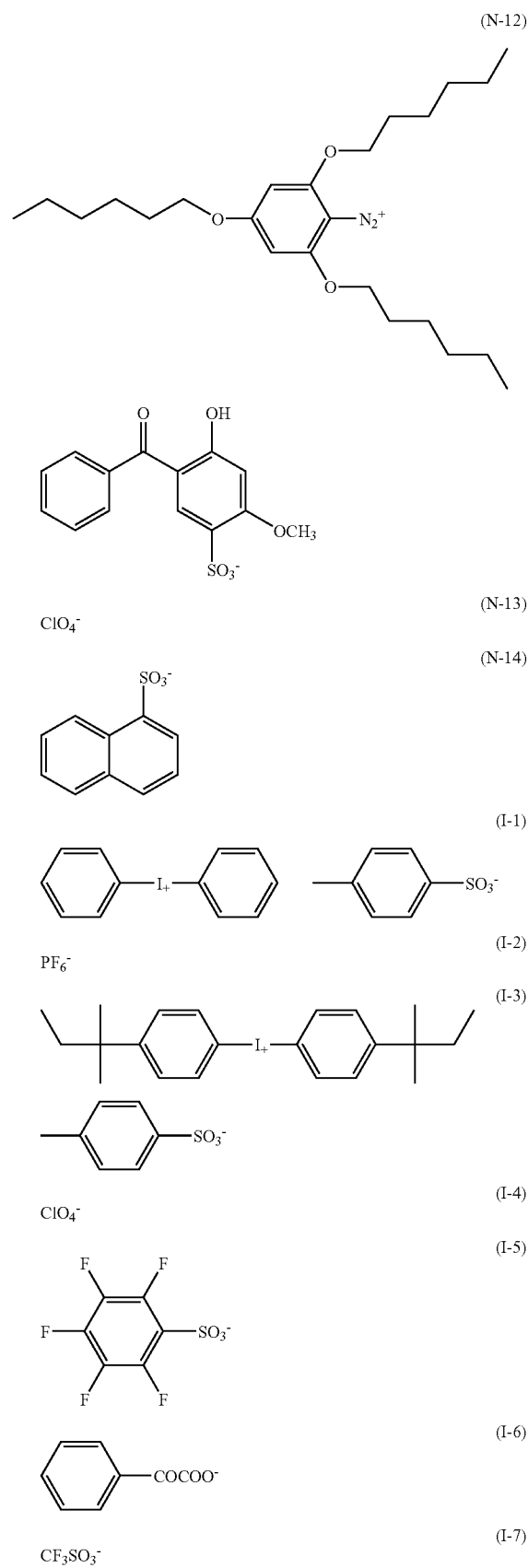

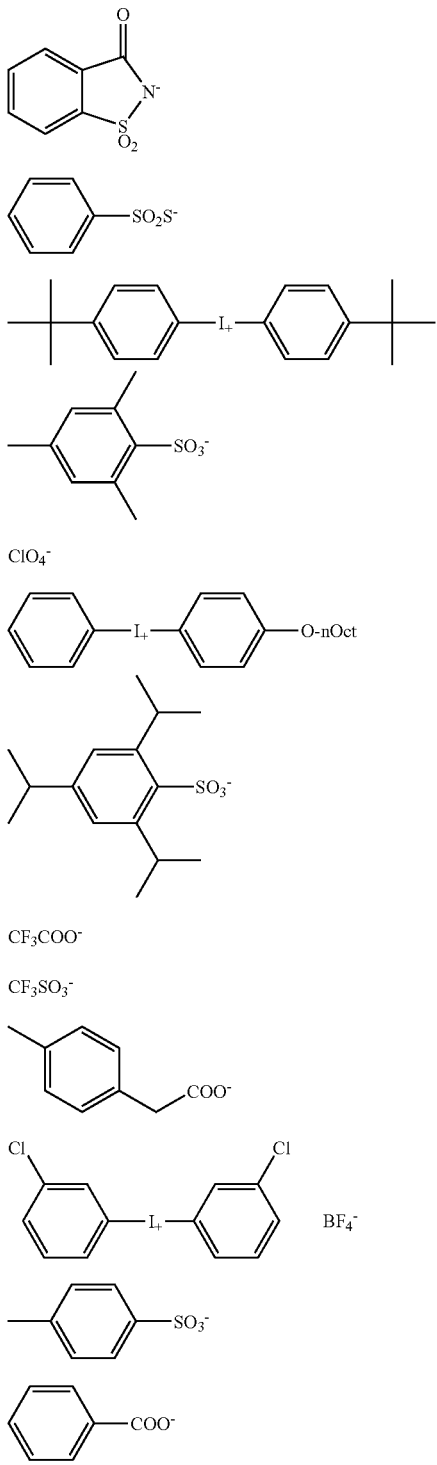

Such a polymerization initiator may be added to the image recording layer in an amount of from 0.1 to 50% by mass based on the total solid matters constituting the image recording layer, preferably from 0.5 to 30% by mass and still preferably from 1 to 20% by mass. So long as the polymerization initiator content falls within this range, a favorable sensitivity and a favorable stain resistance in a non-image part during printing can be obtained. Either one of these polymerization initiators or a mixture of two or more thereof may be used. The polymerization initiator may be added together with other components to a single layer. Alternatively, it may be added to another layer which is separately formed.

[Polymerizable Compound]

A polymerizable compound is an addition-polymerizable compound having at least one ethylenically unsaturated bond which is selected from the group consisting of compounds having at least one, preferably two or more terminal ethylenically unsaturated bond. Such compounds, which have been widely known in the art, can be employed in the invention without specific restriction. These compounds involve those having chemical forms of, for example, monomers, prepolymers (i.e., dimers, termers and oligomers), mixtures thereof and copolymers thereof. Examples of the monomers and copolymers thereof include unsaturated carboxylic acids (for example, acrylic acid, methacrylic acid, itaconic acid, crotonic acid, isocrotonic acid, maleic acid, etc.), esters thereof and amides thereof. It is preferable to use esters of unsaturated carboxylic acids with aliphatic polyhydric alcohols and amides of unsaturated carboxylic acids with aliphatic polyvalent amine compounds. Moreover, use may be appropriately made of addition reaction products of unsaturated carboxylic acid esters or amides having a nucleophilic substituent such as a hydroxyl group, an amino group or a mercapto group with monofunctional or polyfunctional isocyanates or epoxy compounds, dehydrocondensation products thereof with monofunctional or polyfunctional carboxylic acids, etc. In addition, it is also appropriate to use addition reaction products of unsaturated carboxylic acid esters or amides having an electrophilic substituent such as an isocyanate group or an epoxy group with monohydric or polyhydric alcohols, amides or thiols and substitution reaction products of unsaturated carboxylic acid esters or amides having a leaving substituent such as a halogen group or a tosyloxy group with monohydric or polyhydric alcohols, amines or thiols. As further examples, it is also possible to employ compounds prepared by substituting the unsaturated carboxylic acids as described above by unsaturated phosphonic acid, styrene, vinyl ether or the like.

As Particular examples of the monomers of the esters of aliphatic polyhydric alcohol compounds with unsaturated carboxylic acids, citation may be made of acrylic acid esters, e.g., ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, polyester acrylate oligomer, isocyanuric acid EO-denatured triacrylate and so on.

Examples of methacrylic acid esters include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, bis[p-(methacryloxyethoxy)phenyl]dimethylmethane and so on.

Examples of itaconic acid esters include ethylene glycol diitaconate, propylene glycol diitaconate, 1,3-butanediol diitaconate, 1,4-butanediol diitaconate, tetramethylene glycol diitaconate, pentaerythritol diitaconate, sobritol tetraitaconate and so on.

Examples of crotonic acid esters include ethyleneglycol dicrotonate, tetramethylene glycol dicrotonate, pentaerythritol dicrotonate, sorbitol tetracrotonate and so on. Examples of isocrotonic acid esters include ethyleneglycol diisocrotonate, pentaerythritol diisocrotonate, sorbitol tetraisocrotonate and so on. Examples of maleic acid esters include ethyleneglycol dimaleate, triethylene glycol dimaleate, pentaerythritol dimaleate, sorbitol tetramaleate and so on.

As other examples of the esters, use may be appropriately made of aliphatic alcohol type esters described in JP-B-46-27926, JP-B-51-47334 and JP-A-57-196231, those having an aromatic skeleton described in JP-A-59-5240, JP-A-59-5241 and JP-A-2-226149, those having an amino group described in JP-A-1-165613, etc. Furthermore, it is also possible to use mixtures of the ester monomers as described above.

Particular examples of the monomers of amides of aliphatic polyvalent amine compounds with unsaturated carboxylic acids include methylene bis-acrylamide, methylene bis-methacrylamide, 1,6-hexamethyelne bis-acrylamide, 1,6-hexamethyelne bis-methacrylamide, diethylenetriamine trisacrylamide, xylyene bisacrylamide, xylylene bis-methacrylamide and so on. Other preferable examples of amide-type monomers include those having a cyclohexylene structure described in JP-B-54-21726.

Also, a urethane-based addition-polymerizable compound produced by using the addition reaction between isocyanate and a hydroxyl group can be appropriately used. Particular examples thereof include vinylurethane compounds having two or more polymerizable vinyl groups per molecule, which are obtained by adding a vinyl monomer having a hydroxyl group as represented by the following formula (II) to a polyisocyanate compound having two or more isocyanate groups per molecule, as described in, for example, JP-B-48-41708.

$$CH_2=C(R_4)COOCH_2CH(R_5)OH \qquad (II)$$

wherein $R_4$ and $R_5$ represent each H or $CH_3$.

Moreover, use may be appropriately made of urethane acrylates described in JP-A-51-37193, JP-B-2-32293 and JP-B-2-16765, urethane compounds having an ethylene oxide-type skeleton described in JP-B-58-49860, JP-B-56-17654, JP-B-62-39417 and JP-B-62-39418, etc. Furthermore, photopolymerizable compositions having highly favorable photosensitive reaction speed can be obtained by using addition-polymerizable compounds having an amino structure or a sulfide structure in the molecule described in JP-A-63-277653, JP-A-63-260909 and JP-A-1-105238.

Additional examples of the polymerizable compound include polyester acrylates and polyfunctional acrylates and methacrylates such as epoxyacrylates obtained by reacting epoxy resins with (meth)acrylic acid which are described in JP-A-48-64138, JP-B-49-43191 and JP-B-52-30490. Furthermore, specific unsaturated compounds described in JP-B-46-43946, JP-B-1-40337 and JP-B-1-40336 and vinylphosphonic acid type compounds described in JP-A-2-25493 may be cited. In some cases, moreover, it is appropriate to use a structure having a perfluoroalkyl group as described in JP-A-61-22048. It is also possible to use light-hardening monomers and oligomers reported in *Nippon Secchaku Kyokai-shi*, vol. 20, No. 7, p. 300 to 308 (1984).

Details in using such a polymerizable compound (i.e., it structure, either using alone or combinedly, the addition level, etc.) can be arbitrarily selected depending on the design of the performance of a recording material of the lithographic printing plate precursor which is the final product. For example, selection may be made from the following viewpoints.

Concerning the sensitivity, it is preferable to employ a structure containing much unsaturated groups per molecule (preferably being bifunctional or higher in many cases). To elevate the strength in the image part (i.e., the hardened film), a trifunctional or higher compound is preferable. It is also effective to use a combination of compounds having different functional valencies and different polymerizable groups (for example, an acrylic acid ester, a methacrylic acid ester, a styrene-type compound and a vinyl ether-type compound) so as to control both of the sensitivity and the strength.

Considering compatibility with other components in the image recording layer (for example, a binder polymer, an initiator and a colorant) and dispersion properties, the selection and method of use of the polymerizable compound are highly important factors. For example, the compatibility can be improved in some cases by using a compound with a low purity or a combination of two or more compounds. It is also possible to select a specific structure in order to enhance the adhesiveness to a substrate or an overcoat layer as will be described hereinafter.

It is preferable that the content of the polymerizable compound in the image recording layer ranges from 5 to 80% by mass, still preferably from 25 to 75% by mass, based on the nonvolatile components in the layer. Either one polymerizable compound or two or more thereof may be used. In using the polymerizable compound, moreover, its structure, composition and addition level can be appropriately selected from the viewpoints of the degree of polymerization inhibition to oxygen, resolution, fogging, change in refraction index, surface adhesiveness and so on. It is also possible in some cases to employ such a layer structure and coating method as forming undercoating or overcoating.

[Acid Generator]

In the case of using a compound forming an adsorptive group to the hydrophilic support due to an acid, it is preferable to add an acid generator to the layer containing the above compound or a layer adjacent thereto.

As the acid generator, a trihalomethyl-substituted oxazole derivative represented by the following formula (PAG1) or an S-triazine derivative represented by the following formula (PAG2) is preferable.

(PAG1)

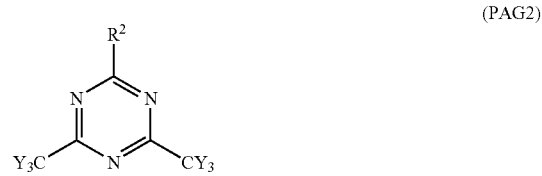

(PAG2)

In the above formulae, $R^1$ represents a substituted or unsubstituted aryl or alkenyl group; $R^2$ represents a substituted or unsubstituted aryl, alkenyl or alkyl group or $-CY_3$, wherein Y represents a chlorine atom or a bromine atom. Specific examples thereof include the following compounds.

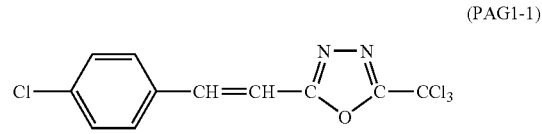

(PAG1-1)

-continued (PAG1-2)
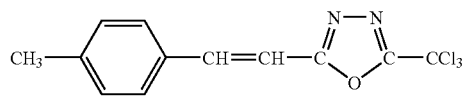

(PAG2-1)
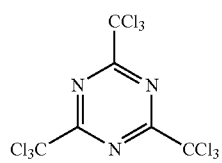

(PAG2-2)
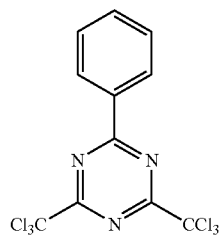

(PAG2-3)
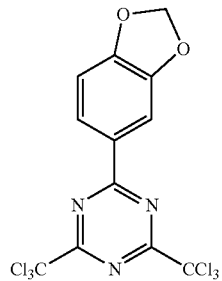

(PAG2-4)
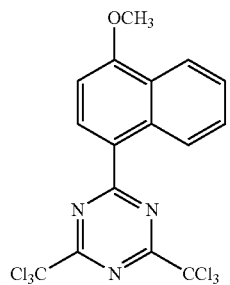

(PAG2-5)
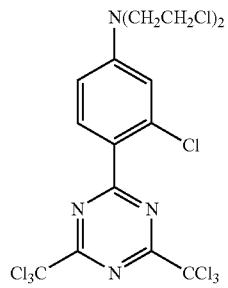

Also, an iodonium salt represented by the following formula (PAG3) and a sulfonium salt or a diazonium salt represented by the formula (PAG4) are preferable.

(PAG3)

-continued (PAG4)

In the above formulae, $Ar^1$ and $Ar^2$ independently represent each a substituted or unsubstituted aryl group. Preferable examples of the substituent include alkyl groups, haloalkyl groups, cycloalkyl groups, aryl groups, alkoxy groups, a nitro group, a carboxyl group, alkoxycarbonyl groups, a hydroxy group, a mercapto group and halogen atoms.

$R^3$, $R^4$ and $R^5$ independently represent each a substituted or unsubstituted alkyl or aryl group, preferably an aryl group having from 6 to 14 carbon atoms, an alkyl group having from 1 to 8 carbon atoms or substituted derivatives thereof. Preferable examples of the substituent include alkoxy groups having from 1 to 8 carbon atoms, alkyl groups having from 1 to 8 carbon atoms, a nitro group, a carboxyl group, a hydroxy group and halogen atoms in the case of an aryl group, and an alkoxy group having from 1 to 8 carbon atoms, a carboxyl group and alkoxycarbonyl groups in the case of an alkyl group.

$Z^1$ represents a counter anion. Examples thereof include perfluoroalkane sulfonate anions such as $BF_4^-$, $AsF_6^-$, $PF_6^-$, $SbF_6^-$, $Si_2F_2^-$, $ClO_4^-$ and $CF_3SO_3^-$; fused polynuclear aromatic sulfonate anions such as pentafluorobenzenesulfonate anion and naphthalene-1-sulfonate anion; anthraquinonesulfonate anion; and sulfonate-containing dyes, though the invention is not restricted thereto.

Two of $R^3$, $R^4$ and $R^5$ and $Ar^1$ and $Ar^2$ may be bonded together via a single bond or a substituent.

Specific examples thereof include the following compounds.

(PAG3-1)
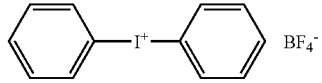

(PAG3-2)
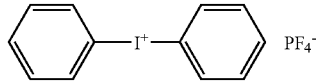

(PAG4-1)
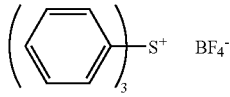

(PAG4-2)
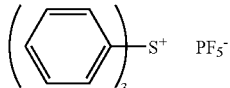

(PAG4-3)
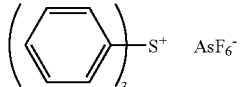

The onium salts represented by the formulae (PAG3) and (PAG4) are described in, for example, J. W. Knapczyk et al., J. Am. Chem. Soc., 91 145 (1969), A. L. Mayock et al., J. Org. Chem., 35, 2532 (1970), B. Goethas et al., Bull. Soc. Chem. Belg., 73, 546 (1964), H. M. Leicester, J. Ame. Chem. Soc., 51, 3587 (1929), J. V. Crivello et al., J. Polym. Chem. Ed., 18, 2677 (1980), U.S. Pat. Nos. 2,807,648, 4,247,473 and JP-A-53-101331.

It is also preferable to use a disulfone derivative represented by the following formula (PAG5) or an iminosulfonate derivative represented by the formula (PAG6).

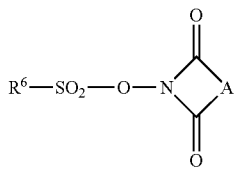

(PAG5)

(PAG6)

In the above formulae, $Ar^3$ and $Ar^4$ independently represent each a substituted or unsubstituted aryl group. $R^6$ represents a substituted or unsubstituted alkyl or aryl group. A represents a substituted or unsubstituted alkylene, alkenylene or arylene group.

Specific examples thereof include the following compounds.

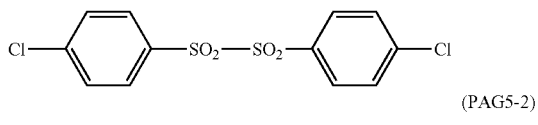

(PAG5-1)

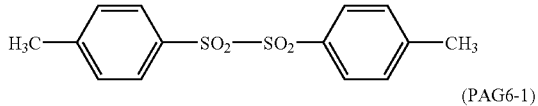

(PAG5-2)

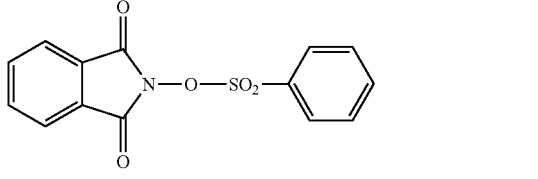

(PAG6-1)

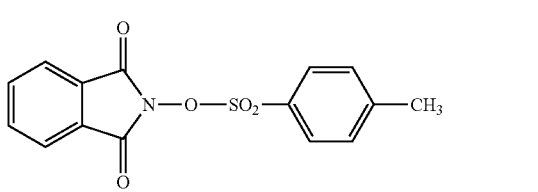

(PAG6-2)

The content of the acid generator preferably ranges from 0.1 to 30% by mass, still preferably from 1 to 15% by mass, based on the total solid matters in the image recording layer.

[Binder Polymer]

As the binder polymer usable in the invention, use may be made of publicly known ones without particular restriction. It is preferable to use a linear organic polymer having film properties. Examples of such binder polymer include acrylic resins, polyvinylacetal resins, polyurethane resins, polyurea resins, polyimide resins, polyamide resins, epoxy resins, methacrylic resins, polystyrene resins, novolak type phenolic resins, polyester resins, synthetic rubbers and natural rubbers.

To improve the film strength in an image part, a crosslinkable binder polymer is preferable. To make a binder polymer crosslinkable, a crosslinkable functional group such as an ethylenically unsaturated bond is introduced into the main chain or side chain of the polymer. Such a crosslinkable functional group may be introduced by copolymerization.

As examples of the polymer having an ethylenically unsaturated bond in the main chain of its molecule, poly-1,4-butadiene, poly-1,4-isoprene, etc. may be cited.

As examples of the polymer having an ethylenically unsaturated bond in the side chain of its molecule, polymers which are acrylic acid or methacrylic acid esters or amides and in which at least a part of the ester or amide residue (i.e., R in —COOR or CONHR) has an ethylenically unsaturated bond may be cited.

Examples of the residue having an ethylenically unsaturated bond (R as described above) include $—(CH_2)_n CR^1=CR^2R^3$, $—(CH_2O)_n CH_2 CR^1=CR^2R^3$, $—(CH_2CH_2O)_n CH_2 CR^1=CR^2R^3$, $—(CH_2)_n NH—CO—O—CH_2 CR^1=CR^2R^3$, $—(CH_2)_n—O—CO—CR^1=CR^2R^3$ and $—(CH_2CH_2O)_n X$ (wherein $R^1$ to $R^3$ represent each a hydrogen atom, a halogen atom or an alkyl group, an aryl group, an alkoxy group or an aryloxy group having from 1 to 20 carbon atoms, or $R^1$ and $R^2$ or $R^3$ may be bonded to form a ring together; n is an integer of from 1 to 10; and X represents a dicyclopentadienyl group).

Specific examples of the ester residue include $—CH_2CH=CH_2$, $—CH_2CH_2O—CH_2CH=CH_2$, $—CH_2C(CH_3)=CH_2$, $—CH_2CH=CH—C_6H_5$, $—CH_2CH_2OCOOCH=CH—C_6H_5$, $—CH_2CH_2OCOC(CH_3)=CH_2$, $—CH_2CH_2OCOCH=CH_2$, $—CH_2CH_2—NHCOO—CH_2CH=CH_2$ and $CH_2CH_2O—X$ (wherein X represents a dicyclopentadienyl group).

Specific examples of the amide residue include $—CH_2CH=CH_2$, $—CH_2CH_2—Y$ (wherein Y represents a cyclohexene group) and $—CH_2CH_2—OCO—CH=CH_2$.

Crosslinkage of the crosslinkable polymer proceeds, for example, as follows. A free radical (a polymerization-initiating radical or a polymerization-developing radical) attaches to the crosslinkable functional group and thus crosslinkage is formed among polymer molecules either directly or mediated by a polymer chain of the polymerizable compound, thereby causing hardening. Alternatively, an atom in the polymer (for example, a hydrogen atom on the carbon atom adjacent to the functional crosslinkable group) is withdrawn by a free radical to form a polymer radical. Then such polymer radicals bind to each other to form crosslinkage among polymer molecules, thereby causing hardening.

The content of the crosslinkable group (the content of radical-polymerizable unsaturated double bond determined by iodine titration) in the binder polymer ranges preferably from 0.1 to 10.0 mmol, still preferably from 1.0 to 7.0 mmol and most desirably from 2.0 to 5.5 mmol program of the binder polymer. So long as its content falls within the above range, a favorable sensitivity and a high storage stability can be obtained.

From the viewpoint of the onboard development of an unexposed part in the image recording layer, it is preferable that the binder polymer is highly soluble or dispersible in an ink and/or a fountain solution.

To elevate the solubility or dispersibility in an ink, it is preferable that the binder polymer has a lipophilic nature. To elevate the solubility or dispersibility in a fountain solution, on the other hand, it is preferable that the binder polymer has a hydrophilic nature. It is, therefore, also effective in the invention to use a lipophilic binder polymer together with a hydrophilic binder polymer.

As the hydrophilic binder polymer, use can be appropriately made of those having a hydrophilic group, for example, a hydroxy group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfonate group or a phosphate group.

Specific examples thereof include gum arabic, casein, gelatin, starch derivatives, carboxymethylcellulose and its sodium salt, cellulose acetate, sodium alginate, vinyl acetate-maleic acid copolymers, styrene/maleic acid copolymers, polyacrylic acids and salts thereof, polymethacrylic acids and salts thereof, hydroxyethyl methacrylate homopolymer and copolymers, hydroxyethyl acrylate homopolymer and copolymers, hydroxypropyl methacrylate homopolymer and copolymers, hydroxypropyl acrylate homopolymer and copolymers, hydroxybutyl methacrylate homopolymer and copolymers, hydroxybutyl acrylate homopolymer and copolymers, polyethylene glycols, hydroxypropylene polymers, polyvinyl alcohols, hydrolyzed polyvinyl acetate, polyvinyl formal, polyvinyl butyral and polyvinyl pyrrolidone each having a degree of hydrolysis of 60% by mass or more, preferably 80% by mass or more, acrylamide homopolymer and copolymers, methacrylamide homopolymer and copolymers, N-methylol acrylamide homopolymer and copolymers, polyvinylpyrrolidone, alcohol-soluble nylon, 2,2-bis-(4-hydroxyphenyl)-propane-epichlorohydrin polyether and so on.

The mass-average molecular weight of the binder polymer is preferably 5,000 or more, still preferably from 10,000 to 300,000. Its number-average molecular weight is preferably 1,000 or more and still preferably from 2,000 to 2,500,000. The polydispersion degree (mass-average molecular weight/number-average molecular weight) is preferably 1 or more, still preferably from 1.1 to 10.

Although the above-described binder polymer may be a random polymer, a block polymer, a graft polymer or the like, a random polymer is preferred.

Such a binder polymer can be synthesized by conventionally known methods. Examples of solvents to be used in the synthesis thereof include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethyl sulfoxide and water. Either one of these solvent or a mixture of two or more thereof may be used.

As a radical polymerization initiator to be use din synthesizing the binder polymer, use can be made of publicly known compounds such as azo initiators and peroxide initiators.

The binder polymer to be used in the invention may be a single compound. Alternatively, use may be made of a mixture thereof.

The content of the binder polymer in the image recording layer preferably ranges from 5 to 90% by mass, still preferably from 10 to 80% by mass and still preferably from 30 to 70% by mass, based on the total solid matters in the image recording layer. So long as its content falls within this range, a favorable strength and favorable image forming properties can be obtained in an image part.

It is also preferred that the polymerizable compound and the binder polymer are employed at a ratio by mass of 1/9 to 7/3.

As a method of adding the above-described image recording layer-constituting components and other constituting components as will be described hereinafter to the image recording layer in the invention, use can be made of several embodiments. In an embodiment, a molecule-dispersion type image recording layer is obtained by dissolving the components in an appropriate solvent and coating, as described in, for example, JP-A-2002-287334. In another embodiment, all or a part of the components are microcapsulated and contained in the image recording layer, i.e., a microcapsule type image recording layer as described in, for example, JP-A-2001-277740 and JP-A-2001-27742. The microcapsule type image recording layer may further contain component(s) other than the microcapsules. To obtain further improved onboard development, it is advantageous to employ such a microcapsule type image recording layer as the image recording layer.

To microcapsulate the image recording layer-constituting components as described above, a publicly known method can be used. To produce microcapsules, for example, use can be made of coacervating methods as described in U.S. Pat. Nos. 2,800,457 and 2,800,458, interfacial polymerization methods as described in U.S. Pat. No. 3,287,154, JP-B-38-19574 and JP-B-42-446, polymer sedimentation methods as described in U.S. Pat. Nos. 3,418,250 and 3,660,304, a method with the use of an isocyanate polyol wall material as described in U.S. Pat. No. 3,796,669, a method with the use of an isocyanate wall material as described in U.S. Pat. No. 3,914,511, methods with the use of urea/formaldehyde or urea/formaldehyde/resorcinol wall-forming materials as described in U.S. Pat. Nos. 4,001,140, 4,087,376 and 4,089,802, methods with the use of wall materials such as a melamine/formaldehyde resin and hydroxycellulose as described in U.S. Pat. No. 4,025,445, in situ methods using a monomer as described in JP-B-36-9163 and JP-B-51-9079, spray drying methods as described in British Patent 930422 and U.S. Pat. No. 3,111,407, and electrolytic dispersion cooling methods as described in British Patent 952807 and British Patent 967074, though the invention is not restricted thereto.

In the invention, it is preferable to use a microcapsule wall which has a three-dimensional crosslinkage and is swellable in a solvent. From this viewpoint, it is preferable that the microcapsule wall is made of polyurea, polyurethane, polyester, polycarbonate, polyamide or a mixture thereof. Among all, polyurea and polyurethane are particularly preferable. Moreover, a compound having a crosslinkable functional group such as an ethylenically unsaturated bond, which can be introduced into the above-described binder polymer, may be introduced into the microcapsule wall.

The particle diameter of the microcapsules as described above preferably ranges from 0.01 to 3.0 µm, still preferably from 0.05 to 2.0 µm and particularly preferably from 0.10 to 1.0 µm. So long as the particle diameter falls within this range, favorable resolution and a high stability with the passage of time can be established.

[Surfactant]

In the image recording layer according to the invention, use may be made of a surfactant in order to promote the onboard development at the initiation of printing and improve the coated face properties upon drying. As the surfactant, nonionic surfactants, anionic surfactants, cationic surfactants, amphoteric surfactants and surfactants containing fluorine may be cited. Either a single surfactant or a combination of two or more may be used.

As the nonionic surfactant to be used in the invention, use may be made of publicly known ones without particular restriction. Examples thereof include polyoxyethylene alkyl ethers, polyoxyethylene alkylphenyl ethers, polyoxyethylene polystyrylphenyl ethers, polyoxyethylene polyoxypropylene alkyl ethers, glyerol fatty acid partial esters, sorbitan fatty acid partial esters, pentaerythritol fatty acid partial esters, propylene glycol monofatty acid partial esters, sucrose fatty acid partial esters, polyoxyethylene sorbitan fatty acid partial esters, polyoxyethylene sorbitol fatty acid partial esters, polyethylene glycol fatty acid esters, polyglycerol fatty acid partial esters, polyoxyethylenated castor oils, polyoxyethylene glycerol fatty acid partial esters, fatty acid diethanolamides, N,N-bis-2-hydroxyalkylamines, polyoxyethylene alkylamines, triethanolamine fatty acid esters, trialkylamine oxides, polyethylene glycol, polyethylene glycol/polypropylene copolymer and so on.

As the anionic surfactant to be used in the invention, use may be made of publicly known ones without particular restriction. Examples thereof include fatty acid salts, abietic acid salts, hydroxyalkanesulfonic acid salts, alkanesulfonic acid salts, dialkylsulfosuccinic acid ester salts, linear alkylbenzenesulfonic acid salts, branched alkylbenzenesulfonic acid salts, alkylnaphthalenesulfonic acid salts, alkylphenoxypolyoxyethylene propylsulfonic acid salts, polyoxyethylene alkylsulfophenyl ether salts, N-methyl-N-oleyltaurine sodium salt, N-alkylsulfossucinic acid monoamide disodium salts, petroleum sulfonic acid salts, sulfated beef tallow, fatty acid alkyl ester sulfuric acid ester salts, alkylsulfuric acid ester salts, polyoxyethyelne alkyl ether sulfuric acid ester salts, fatty acid monoglceride sulfuric acid ester salts, polyoxyethylene alkylphenyl ether sulfuric acid ester salts, polyoxyethylene styrylphenyl ether sulfuric acid ester salts, alkylphosphoric acid ester salts, polyoxyethylene alkyl ether phosphoric acid ester salts, polyoxyethylene alkylphenyl ether phosphoric acid ester salts, partly saponified styrene/maleic anhydride copolymers, partly saponified olefin/maleic anhydride copolymers and naphthalenesulfonic acid salt/formalin condensates.

As the cationic surfactant to be used in the invention, use may be made of publicly known ones without particular restriction. Examples thereof include alkylamine salts, quaternary ammonium salts, polyoxyethylene alkylamine salts and polyethylene polyamine derivatives.

As the amphoteric surfactant to be used in the invention, use may be made of publicly known ones without particular restriction. Examples thereof include carboxybetaines, aminocarboxylic acids, sulfobetaines, aminosulfuric acid esters and imidazolines.

In the above-described surfactants, the term "polyoxyethylene" is also applicable to other "polyoxyalkylenes" such as polyoxymethylene, polyoxypropylene and polyoxybutylene. Such surfactants are also usable in the invention.

As a still preferable example of the surfactant, a fluorine-containing surfactant having a perfluoroalkyl group in its molecule can be cited. Examples of such a surfactant include anionic surfactants such as perfluoroalkylcarboxylic acid salts, perfluoroalkylsulfonic acid salts, perfluoroalkylphoshporic esters; amphoteric surfactants such as perfluoroalkylbetaines; cationic surfactants such as perfluoroalkyltrimethylammonium salts; and nonionic surfactants such as perfluoroalkylamine oxides, perfluoroalkyl ethylene oxide adducts, oligomers having a perfluoroalkyl group and a hydrophilic group, oligomers having a perfluoroalkyl group and a lipophilic group, oligomers having a perfluoroalkyl group, a hydrophilic group and a lipophilic group, and urethanes having a perfluoroalkyl group and a lipophilic group. Also, fluorine-containing surfactants described in JP-A-62-170950, JP-A-62-226143 and JP-A-60-168144 can be also cited as preferable ones.

Either one of these surfactants or a combination of two or more thereof may be used.

It is preferable that the image recording layer contains from 0.001 to 10% by mass, still preferably from 0.01 to 5% by mass, of the surfactant.

[Colorant]

The image recording layer according to the invention may further contain additives other than the above-described components, for example, a dye having a large absorption in the visible light region for coloring an image. Particular examples thereof include Oil Yellow #101, Oil Yellow #103, Oil Pink #312, Oil Green BG, Oil Blue BOS, Oil Blue #603, Oil Black BY, Oil Black BS and Oil Black T-505 (manufactured by Orient Chemical Industries, Ltd.), Victoria Pure Blue, Crystal Violet (CI42555), Methyl Violet (CI42535), Ethyl Violet, Rhodamine B (CI45170B), Malachite Green (CI42000), Methylene Blue (CI52015), etc. and dyes described in JP-A-62-293247. Moreover, use may be appropriately made of pigments such as phthalocyanine pigments, azo pigments, carbon black and titanium oxide.

It is preferable to add such a coloring agent in an amount of from 0.01 to 10% by mass based on the total solid matters in the image recording material.

[Printout Agent]

To the image recording layer according to the invention, a compound undergoing a color change by the action of an acid or a radical can be added to form a printout image. As such a compound, it is effective to employ various colorants of, for example, diphenylmethane, triphenylmethane, thiazine, oxazine, xanthene, anthraquinone, iminoquinone, azo and azomethine types.

Specific examples thereof include Brilliant Green, Ethyl Violet, Methyl Green, Crystal Violet, Basic Fucsine, Methyl Violet 2B, Quinaldine Red, Rose Bengal, Metanyl Yellow, thymol sulfophthaleine, Xylenol Blue, Methyl Orange, Paramethyl Red, Congo Red, Benzopurpurine 4B, α-Naphthyl Red, Nile Blue 2B, Nile Blue A, Methyl Violet, Malachite Green, Parafucsine, Victoria Pure Blue BOH (manufactured by Hodogaya Chemical Co., Ltd.), Oil Blue #603 (manufactured by Orient Chemical Industries, Ltd.), Oil Oink #312 (manufactured by Orient Chemical Industries, Ltd.), Oil Red 5B (manufactured by Orient Chemical Industries, Ltd.), Oil Scarlet #308 (manufactured by Orient Chemical Industries, Ltd.), Oil Red OG (manufactured by Orient Chemical Industries, Ltd.), Oil Red RR (manufactured by Orient Chemical Industries, Ltd.), Oil Green #502 (manufactured by Orient Chemical Industries, Ltd.), Spiron Red BEH Special (manufactured by Hodogaya Chemical Co., Ltd.), m-Cresol Purple, Cresol Red, Rhodamine B, Rhodamine 6Q Sulforhodamine B, Aulamine, 4-p-diethylaminophenyliminonaphthoquine, 2-carboxyanilino-4-p-diethylaminophenyliminonaphthoquine, 2-carboxystearylamino-4-p-N,N-bis(hydroxyethyl)amino-phenyliminonaphthoquine, dyes such as 1-phenyl-3-methyl-4-p-diethylaminophenylimino-5-pyrazolone and 1-β-naphthyl-4-p-diethylaminophenylimino-5-pyrazolone, and leuco dyes such as p',p''-hexamethyltriaminotriphenylmethane (Leucocrystal Violet) and Pergascript Blue SRB (manufactured by Ciba-Geigy).

In addition to the above-described dyes, leuco dyes which have been known as materials for heat-sensitive paper and pressure-sensitive paper are also appropriately usable. Specific examples thereof include Crystal Violet Lactone, Malachite Green Lactone, Benzoyl Leucomethylene Blue, 2-(-N-phenyl-N-methylamino)-6-(N-p-tolyl-N-ethyl)aminofluorane, 2-anilino-3-methyl-6-(N-ethyl-p-toluidino) fluorane, 3,6-dimethoxyfluorane, 3-(N,N-diethylamino)-5-methyl-7-(N,N-dibenzylamino)-fluorane, 3-(N-cyclohexyl-N-methylamino)-6-methyl-7-anilinofluorane, 3-(N,N-diethylamino)-6-methyl-7-anilinofluorane, 3-(N,N-diethylamino)-6-methyl-7-xylidinofluorane, 3-(N,N-diethylamino)-6-metmhyl-7-chlorofluorane, 3-(N,N-diethylamino)-6-methoxy-7-aminofluorane, 3-(N,N-diethylamino)-7-(4-chloroanilino)fluorane, 3-(N,N-diethylamino)-7-chlorofluorane, 3-(N,N-diethylamino)-7-benzylaminofluorane, 3-(N,N-diethylamino)-7,8-benzofluorane, 3-(N,N-dibutylamino)-6-methyl-7-anilinofluorane, 3-(N,N-dibutylamino)-6-methyl-7-xylidinofluorane, 3-piperidino-6-methyl-7-anilinofluorane, 3-pyrolidino-6-methyl-7-anilinofluorane, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-phthalide, 3-(4-diethylaminophenyl)-3-(1-ethyl-2-methylindol-3-yl) phthalide and so on.

It is preferable to add such a dye undergoing a color change by the action of an acid or a radical to the image recording layer at a ratio of from 0.01 to 10% by mass based on the total solid matters.

[Polymerization Inhibitor]

It is preferable to add a small amount of a polymerization inhibitor to the image recording layer according to the invention in order to prevent the radical polymerizable compound (C) from unnecessary heat polymerization during the production or storage of the image recording layer.

Preferable examples of the heat polymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol) and N-nitroso-N-phenylhydroxylamine aluminum salt.

It is preferable that the image recording layer contains the heat polymerization initiator in an amount of from about 0.01 to about 5% by mass.

[Higher Fatty Acid Derivative]

To prevent polymerization inhibition by oxygen, the image recording layer according to the invention may contain a higher fatty acid derivative such as behenic acid or behenic acid amide. The higher fatty acid derivative may be localized on the surface of the image recording layer in the course of drying following coating. The content of the higher fatty acid derivative preferably ranges from about 0.1 to about 10% by mass based on the total solid matters in the image recording layer.

[Plasticizer]

To improve the onboard development properties, the image recording layer according to the invention may contain a plasticizer.

Preferable examples of the plasticizer include phthalic acid esters such as dimethyl phthalate, diethyl phthalate, dibutyl phthalate, diisobutyl phthalate, dioctyl phthalate, octylcapryl phthalte, dicyclohexyl phthalate, ditridecyl phthalate, butylbenzyl phthalate, diisodecyl phthalate and diallyl phthalate; glycol esters such as dimethyl glycol phthalate, ethylphthalyethyl glycolate, methylphthalylethyl glycolate, butylphthalylbutyl glycolate and triethylene glycol dicaprylic acid ester; phosphoric acid esters such as tricresyl phosphate and triphenyl phosphate; aliphatic dibasic acid esters such as diisobutyl adipate, dioctyl adipate, dimethyl sebacate, dibutyl sebacate, dioctyl azelate and dibutyl maleate; polyglycidyl methacrylate, triethyl citrate, glycerol triacetyl ester and butyl laurate.

[Inorganic Fine Particle]

To enhance the hardened film strength in an image part and the onboard development properties in a non-image part, the image recording layer according to the invention may contain inorganic fine particles.

Preferable examples of the inorganic fine particles include those made of silica, alumina, magnesium oxide, titanium oxide, magnesium carbonate, calcium alginate or a mixture thereof These inorganic fine particles are usable in strengthening a film and improving interfacial adhesion by surface roughening, though they have no heat-light converting properties.

The average particle diameter of the inorganic fine particles ranges preferably from 5 nm to 10 μm, still preferably from 0.5 μm to 3 μm. So long a the particle diameter falls within the above range, the inorganic fine particles are stably dispersed in the image recording layer so that the film strength of the image recording layer can be sustained at a sufficient level and a highly hydrophilic non-image part scarcely suffering from staining during printing can be obtained.

The inorganic fine particles as described above can be easily obtained as a marketed product such as a colloidal silica dispersion.

It is preferable that the content of the inorganic fine particles is 20% by mass or less, still preferably 10% by mass or less based on the total solid matters in the image recording layer.

[Low-Molecular Weight Hydrophilic Compound]

To improve the onboard development properties, the image recording layer according to the invention may contain a low-molecular weight hydrophilic compound. Examples of the low-molecular weight hydrophilic compound include water-soluble organic compounds, e.g., glycols such as ethylene glycol, diethylene glycol, triethylene glycol, propylene glycol, dipropylene glycol and tripropylene glycol, ethers or esters thereof, polyhydroxy compounds such as glycerol and pentaerythritol, organic amines such as triethanolamine, diethanolamine and monoethanolamine and salts thereof, organic sulfonic acids such as toluenesulfonic acid and benzenesulfonic acid and salts thereof, organic phosphonic acids such as phenylphosphonic acid and salts thereof and organic carboxylic acids such as tartaric acid, oxalic acid, citric acid, malic acid, lactic acid, gluconic acid and amino acids and salts thereof.

[Formation of Image Recording Layer]

The image recording layer according to the invention may be formed by dissolving the components required in the image recording layer as described above in a solvent and coating the thus prepared coating solution. Examples of the solvent to be used herein include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethyl urea, N-methyl pyrrolidone, dimethyl sulfoxide, sulfolane, γ-butyrolactone, toluene and water, though the invention is not restricted thereto. Either one of these solvents or a mixture thereof may be used. The concentration of the solid matters in the coating solution appropriately ranges from 1 to 50% by mass.

It is also possible to form the image recording layer according to the invention by dispersing/dissolving the same or different components as described above in the same or different solvents to give a plural number of coating solutions and repeating the coating and drying steps twice or more.

It is generally preferable that the coating amount (solid content) of the image recording layer on the support after drying ranges from about 0.3 to about 3.0 g/m$^2$, though it varies depending on use. So long as the coating amount falls within this range, a favorable sensitivity and favorable film properties of the image recording layer can be obtained.

Coating may be performed by various methods such as bar coater coating, spin coating, spray coating, curtain coating, dip coating, air knife coating, blade coating and roll coating.

[Support]

The support to be used in the lithographic printing plate precursor according to the invention is not particularly restricted, so long as it is a sheet type material having a high dimensional stability. Examples thereof include papers, papers having plastics (for example, polyethylene, polypropylene, polystyrene, etc.) laminated thereon, metal sheets (for example, aluminum, zinc, copper, etc.), plastic films (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc.) and papers and plastic films having the above-described metals laminated or evaporated thereon. Among all, a polyester film and an aluminum sheet are preferable as the support. In particular, an aluminum sheet is preferred because of being excellent in dimensional stability and relatively less expensive.

Appropriate examples of the aluminum sheets are pure aluminum sheets and alloy sheets comprising aluminum as the main component together with a different element in a trace amount. Moreover, it is also possible to use an aluminum or aluminum alloy sheet having a plastic laminated or evaporated thereon. Examples of the different element contained in the aluminum alloys include silicon, iron, manganese, copper, magnesium, chromium, zinc, bismuth, nickel, titanium and so on. It is preferable that the content of such a different element in an alloy is 10% by mass at the largest. Although pure aluminum is appropriate as the aluminum sheet to be used in the invention, completely pure aluminum can be hardly produced from the viewpoint of refining techniques. Thus, use may be made of one containing a small amount of a different element. That is to say, the aluminum sheet to be applied in the invention is not restricted in its composition but aluminum sheets having been publicly known and used can be appropriately employed.

The thickness of the support ranges preferably from about 0.1 to 0.6 mm, still preferably from 0.15 to 0.4 mm and particularly preferably from 0.2 to 0.3 mm.

Before using the aluminum sheet, it is preferable to carry out a surface treatment such as roughening or anodic oxidation. Owing to the surface treatment, the hydrophilic nature can be improved and the adhesion of the image recording layer to the support can be ensured. Before roughening the surface of the aluminum sheet, a degreasing treatment is carried out to remove a rolling-mill oil from the surface with the use of, for example, a surfactant, an organic solvent, an aqueous alkali solution or the like.

The treatment for roughening the aluminum sheet surface can be carried out by various methods, for example, a mechanical roughening method, an electrochemical surface roughening method (a method of roughening the surface by electrochemically solubilizing the surface) and a chemical surface roughening method (a method of chemically solubilizing the surface selectively).

As the mechanical roughening method, use can be made of publicly known methods such as the ball grinding method, the brush grinding method, the blast grinding method and the buff grinding method.

As the electrochemical surface roughening method, use may be made of a roughening method which is carried out in a hydrochloric acid or nitric acid electrolytic solution under an alternating current or a direct current. It is also possible to use an acid mixture as disclosed in JP-A-54-63902.

If necessary, the thus surface-roughened aluminum sheet may be further subjected to alkali etching with the use of an aqueous solution of, for example, potassium hydroxide or sodium hydroxide and neutralization followed by anodic oxidation, if desired, to improve the abrasion resistance of the surface.

As the electrolyte to be employed in the anodic oxidation of the aluminum sheet, use may be made of various electrolytes forming a porous oxidation film. In general, sulfuric acid, hydrochloric acid, oxalic acid, chromic acid or a mixture of these acids is used. The concentration of such an electrolyte may be appropriately determined depending on the type of the electrolyte.

The treatment conditions for the anodic oxidation cannot be determined in general since they vary depending on the electrolyte employed. In general, it is appropriate that the concentration of the electrolyte solution ranges from 1 to 80% by mass, the solution temperature ranges from 5 to 70° C., the current density ranges from 5 to 60 A/dm$^2$, the voltage ranges from 1 to 100 V and the electrolysis time ranges from 10 sec to 5 min. It is appropriate that the amount of the anodic oxidation film is 1.0 to 5.0 g/m$^2$, still preferably from 1.5 to 4.0 g/m$^2$. Within this range, favorable printing tolerance and favorable scuff resistance in a non-image part can be established.

As the support to be used in the present invention, use may be made of a substrate as such, i.e., having been subjected to the above-described surface treatment and being provided with an anodic oxidation film. To further improve the adhesion to the upper layer, hydrophilic nature, stain-resistance, heat-insulating properties and so on, it can be optionally subjected to a treatment selected from among a treatment for enlarging micropores in the anodic oxidation film, a treatment for clogging the micropores, a surface-hydrophilization treatment by soaking in an aqueous solution containing a hydrophilic compound and so on, as described in JP-A-2001-253181 and JP-A-2001-322365.

The hydrophilization treatment may be carried out by the method with the use of an alkali metal silicate as disclosed by U.S. Pat. Nos. 2,714,066, 3,181,461, 3,280,734 and 3,902,734. In this method, the support is soaked in an aqueous sodium silicate solution or electrolyzed. Alternatively, use may be made of a method of treating with potassium fluorozirconate as disclosed by JP-B-36-22063 or a method of treating with polyvinylphosphonic acid as disclosed by U.S. Pat. Nos. 3,276,868, 4,153,461 and 4,689,272.

In the case of using a support having an insufficient surface hydrophilic nature (for example, a polyester film) as the support according to the invention, it is desirable to form a hydrophilic layer to impart hydrophilic nature to the surface. As the hydrophilic layer, it is preferable to employ a hydrophilic layer formed by applying a coating solution containing a colloid of an oxide or a hydroxide of at least one element selected from among beryllium, magnesium, aluminum silicon, titanium, boron, germanium, tin, zirconium, iron, banadium, antimony and transition metals as reported by JP-A-2001-199175, a hydrophilic layer having an organic hydrophilic matrix obtained by crosslinking or pseudo-crosslinking an organic hydrophilic polymer as reported by JP-A-2002-79772, a hydrophilic layer having an inorganic hydrophilic matrix obtained by the sol-gel conversion via the hydrolysis or condensation of polyalkoxysilane, titanate, zirconate or aluminate, or a hydrophilic layer comprising an inorganic film containing a metal oxide in the surface. Among all, a hydrophilic layer formed by applying a coating solution containing a silicone oxide or hydroxide colloid is favorable.

In the case of using a polyester film or the like as the support according to the invention, it is preferable to form antistatic layer(s) in the opposite side of the support to the hydrophilic layer or in the both sides thereof. Such an antistatic layer formed between the support and the hydrophilic layer contributes to the improvement in the adhesion to the hydrophilic layer. As the antistatic layer, use can be made of, for example, a polymer layer having fine metal oxide particles or matting agent particles dispersed therein as described in JP-A-2002-79772.

The centerline average roughness of the support ranges preferably from 0.10 to 1.2 μm. Within this range, a favorable adhesion to the image recording layer, a favorable printing tolerance and an excellent stain resistance can be established.

The color density of the support expressed in reflective density ranges preferably from 0.15 to 0.65. Within this range, favorable image forming properties and favorable post-development plate characteristics can be obtained by the prevention of halation at image exposure.

[Backcoat Layer]

After surface-treating the support or forming an undercoat layer, a backcoat may be formed on the back face of the support, if necessary.

As the backcoat, it is preferable to use coating layers made of an organic polymer compound described in JP-A-5-45885 or a metal oxide obtained by hydrolyzing and polycondensing an organic or inorganic metal compound described in JP-A-6-35174. Among these coating layers, a coating layer made of metal oxide obtained from a silicon alkoxy compound such as $Si(OCH_3)_4$, $Si(OC_2H_5)_4$, $Si(OC_3H_7)_4$ or $Si(OC_4H_9)_4$ is particularly preferable, since such a material is easily available at a low cost.

[Undercoat Layer]

If desired, the lithographic printing plate precursor according to the invention to be used in the lithographic printing method according to the invention may further have an undercoat layer between the image recording layer and the support. It is advantageous to form the undercoat layer, since it serves as a heat-insulating layer and thus heat generated by the infrared laser irradiation can be efficiently utilized without diffusion toward the support, thereby achieving a high sensitivity. In an unexposed part, the undercoat layer facilitates the separation of the image recording layer from the support and thus improved the onboard development properties.

As the undercoat layer, use can be made of a silane coupling agent having an ethylenically unsaturated bond reactive group capable of undergoing addition polymerization and a phosphorus compound having an ethylenically unsaturated bond reactive group can be appropriately cited, as reported by JP-A-10-282679.

The coating amount of the undercoat layer ranges preferably from 0.1 to 100 mg/m$^2$ (in terms of solids), still preferably from 3 to 30 mg/m$^2$.

[Protective Layer]

If necessary, the lithographic printing plate precursor according to the invention to be used in the lithographic printing method according to the invention may further have a protective layer on the above-described image recording layer in order to prevent scuffs in the image recording layer, block oxygen and prevent ablation upon high-illumination laser exposure.

In the invention, exposure is usually performed in the atmosphere. The protective layer prevents the image recording layer from the invasion of low-molecular weight compounds such as oxygen and basic substances which occur in the atmosphere and inhibit the image formation reaction proceeding due to the exposure, thereby enables the exposure in the atmosphere. Accordingly, it is required that such a protective layer has a low permeability for the low-molecular weight compounds such as oxygen but a high permeability for light to be used in the exposure, is excellent in the adhesion to the image recording layer and can be easily removed in the development step following the exposure. Concerning such a protective layer, devices have been made as reported in detail in U.S. Pat. No. 3,458,311 and JP-A-55-49729.

As materials usable in the protective layer, it is favorable to employ, for example, water-soluble polymer compounds having relatively high crystallinity. More specifically speaking, there have been known water-soluble polymers such as polyvinyl alcohol, polyvinylpyrrolidone, acidic celluloses, gelatin, gum arabic and polyacrylic acid. Among these polymers, the most desirable results in fundamental properties (oxygen-blocking, removal in development, etc.) can be obtained by using polyvinyl alcohol (PVA) as the main component. The polyvinyl alcohol to be used in the protective layer may be partly substituted by an ester, an ether or acetal, so long as it carries unsubstituted vinyl alcohol units for achieving the required oxygen-blocking properties and solubility in water. Similarly, it may partly have another comonomer.

Particular examples of the polyvinyl alcohol include those which are hydrolyzed to an extent of 71 to 100% and have a degree of polymerization of from 300 to 2400. More specifically speaking, use can be made of PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, L-8, etc. each manufactured by KURARAY.

The components (the type of PVA, use of additive(s)), coating amount, etc. of the protective layer are appropriately selected by taking the oxygen-blocking properties and development removal as well as fogging, adhesiveness and scuff resistance into consideration. In general, a higher hydrolysis ratio of the employed PVA (i.e., the higher content of the unsubstituted vinyl alcohol units in the protective layer) brings about the higher oxygen-blocking properties, which is advantageous from the viewpoint of sensitivity. To prevent the occurrence of an unnecessary polymerization during production or storage and unnecessary fogging or line thickening during exposure of the image, it is preferred to control the oxygen permeability. Thus, it is preferable that the oxygen permeability (A) at 25° C. under 1 atm is $0.2 \leq A \leq 20$ (cc/m$^2$day).

As additional components of the protective layer, use can be made of several % by mass (based on the (co)polymer) of glycerol, dipropylene glycol, etc. to thereby impart flexibility. It is also possible to add several % by mass (based on the (co)polymer) of an anionic surfactant such as a sodium alkylsulfate or a sodium alkylsulfonate; an amphoteric surfactant such as an alkylaminocarboxylic acid salt or an alkylaminodicarboxylic acid salt; or a nonionic surfactant such as a polyoxyethylene alkyl phenyl ether.

The film thickness of the protective layer ranges appropriately from 0.05 to 5 μm, still appropriately from 0.1 to 2 μm.

Adhesion to an image part, scuff resistance, etc. of the protective layer are highly important in handling the lithographic printing plate precursor. That is to say, when a hydrophilic protective layer made of a water-soluble polymer compound is laminated upon a lipophilic image recording layer, the insufficient adhesive force frequently causes the separation of the protective layer and the separated part induces troubles such as film hardening failure due to the inhibition of the polymerization by oxygen.

To overcome this problem, various proposals have been made to improve the pressure-sensitive adhesion between the image recording layer and the protective layer. For example, JP-A-49-70702 and British Patent 1303578 report that a sufficient pressure-sensitive adhesion can be achieved by mixing a hydrophilic polymer mainly comprising polyvinyl alcohol with 20 to 60% by mass of an acrylic emulsion, a water-insoluble vinylpyrrolidone/vinyl acetate copolymer, etc. and laminating on the image recording layer. Any of these publicly known techniques are applicable to the protective layer in the invention. Methods of coating the protective layer are described in, for example, U.S. Pat. No. 3,458,311 and JP-A-55-49729.

Further functions may be imparted to the protective layer. For example, addition of a coloring agent (e.g., a water-soluble dye) having an excellent permeability of infrared rays employed in the exposure and being capable of well absorbing rays of other wavelengths makes it possible to improve safe light applicability without lowering sensitivity.

[Exposure]

In the lithographic printing method according to the invention, the above-described lithographic printing plate precursor is exposed imagewise to infrared laser beams.

Although the infrared laser to be used in the invention is not particularly restricted, it is preferable to use a solid laser or a semiconductor laser radiating infrared rays of 760 nm to 1200 nm. The output of the infrared laser is preferably 100 mW or more. To shorten the exposure time, it is preferable to use a multibeam laser device.

It is preferable that the exposure time per pixel is not longer than 20 µsec. The irradiation energy preferably ranges from 10 to 300 mJ/cm$^2$.

[Printing]

In the lithographic printing method according to the invention, the lithographic printing plate precursor according to the invention is exposed imagewise to an infrared laser as described above. Next, an oily ink and an aqueous component are supplied and printing is carried out, without employing the development step.

More specifically speaking, a method wherein the lithographic printing plate precursor is exposed to an infrared laser and then loaded on a printing machine followed by printing without resort to a development step, a method wherein the lithographic printing plate precursor is loaded on a printing machine and then exposed to an infrared laser on the printing machine followed by printing without resort to a development step, etc. may be cited.

After exposing imagewise the lithographic printing plate precursor with the infrared laser, an oily ink and an aqueous component are supplied and printing is carried out, without employing the development step such as the wet development treatment. In the exposed part of the image recording layer, the image recording layer hardened by the exposure provides an oily ink-receiving part having a lipophilic surface. In the unexposed part, on the other hand, the unhardened image recording layer is dissolved or dispersed in the aqueous component and/or the oily ink supplied thereto and removed. Thus, the hydrophilic surface is exposed in this part.

As a result, the aqueous component adheres to the hydrophilic surface thus exposed, while the oily ink adheres to the image recording layer in the exposed area, thereby initiating printing. Either the oily ink or the aqueous component may be first supplied to the plate, it is preferred to supply the oily ink first so as to prevent the unexposed part of the image recording layer from staining with the aqueous component. As the aqueous component and the oily ink, use can be made of a fountain solution and an oily ink commonly employed in lithography.

The lithographic printing plate precursor is thus onboard developed on an offset printing machine and employed as such in printing a large number of sheets.

EXAMPLES

Example 1

(1) Formation of Support

To remove the rolling mill oil from the surface of an aluminum plate of 0.3 mm in thickness (Material 1050), the aluminum plate was degreased with a 10% aqueous solution of sodium aluminate at 50° C. for 30 seconds. Next, the aluminum surface was sandblasted with three nylon brushes (bristle diameter: 0.3 mm) and an aqueous suspension of pumice (median diameter: 25 µm, specific gravity: 1.1 g/cm$^3$) and thoroughly washed with water. Then the plate was etched by soaking in a 25% aqueous sodium hydroxide solution at 45° C. for 9 seconds, washed with water, then soaked in 20% nitric acid at 60° C. for 20 seconds and washed with water. The etching amount of the sandblasted surface was about 3 g/m$^2$.

Under an alternating current at 60 Hz, the aluminum plate was continuously surface-roughened electrochemically. The electrolyte solution employed was a 1% by mass aqueous solution of nitric acid (containing 0.5% by mass of aluminum ion and 0.007% by mass of ammonium ion) at 50° C. In the alternating power source employed, the time TP required for the achievement of the peak current value from zero was 0.8 msec and the duty ratio was 1:1. By using a combination of a trapezoidal wave with a rectangular wave as an alternate current, electrochemical surface-roughening was effected with the use of a carbon electrode as a counter electrode. Ferrite was employed as a supporting anode. The current density at the peak was 30 A/dm$^2$, and the electricity expressed in the total electricity at the point of using the aluminum plate as the anode was 175 C/dm$^2$. 5% of the current flowing from the power source was shunted into the supporting anode. Subsequently, the aluminum sheet was spray-washed with water.

Next, the aluminum plate was electrochemically surface roughened by the same method as in the nitrate electrolysis by using a 0.5% by mass aqueous solution of hydrochloric acid (containing 0.5% by mass of aluminum ion) at 50° C. The electricity expressed in the total electricity at the point of using the aluminum plate as the anode was 50 C/dm$^2$. Subsequently, the plate was spray-washed with water. On this plate, a direct current anode oxidation coating (2.5 g/m$^2$) was formed at a current density of 15 A/dm$^2$ by using 15% sulfuric acid (containing 0.5% by mass of aluminum ion) as an electrolytic solution. After washing with water and drying, the plate was further treated with a 2.5% by mass aqueous solution of sodium silicate at 30° C. for 10 seconds. The centerline average roughness (Ra) of this substrate measured with a needle of 2 µm in diameter was 0.51 µm.

(2) Preparation of microcapsule Dispersion

As oily phase components, 10 g of trimethylol propane/xylene diisocyanate adduct (TAKENATE D-110N, manufactured by Mitsui Takeda Chemical), 3.15 g of pentaerythritol acrylate (SR444, manufactured by Nippon Kayaku Co., Ltd.), 0.35 g of the following infrared absorbing agent (2), 1 g of 3-(N,N-diethyamino)-6-methyl-7-anilinofluorane (ODB, manufactured by Yamamoto Kasei) and 0.1 g of PIO-NIN A-41C (manufactured by Takemoto Oil and Fat Co., Ltd.) were dissolved in 17 g of ethyl acetate.

Infrared absorbing agent (2)

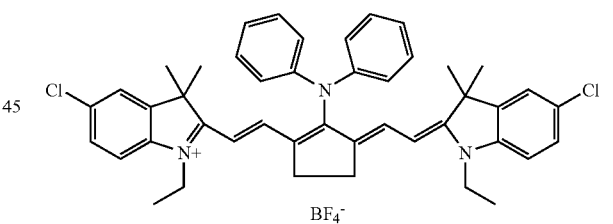

As an aqueous phase component, 40 g of a 4% by mass solution of PVA-205 was prepared. The oily phase components and the aqueous phase component were mixed together and emulsified in a homogenizer at 12,000 rpm for 10 minutes. The obtained emulsion was added to 25 g of distilled water, stirred at room temperature for 30 minutes and then stirred at 40° C. for 3 hours. The solid concentration of the microcapsule solution thus obtained was adjusted to 15% by mass with distilled water. The average particle diameter was 0.25 µm.

2.640 g of the microcapsule solution was mixed with 2.425 g of water to give a microcapsule dispersion.

(3) Preparation of Sensitizing Solution

A sensitizing solution of the following composition was prepared.

| Sensitizing solution (1) | |
|---|---|
| Binder polymer (1), see below | 0.162 g |
| Polymerization initiator (1), see below | 0.100 g |
| Infrared absorbing agent (1), see below | 0.020 g |
| Compound (2) | 0.05 g |
| Polymerizable compound (Aronix M-215 manufactured by Toagosei Chemical Industries) | 0.385 g |
| Fluorine-containing surfactant (1), see below | 0.044 g |
| Methyl ethyl ketone | 1.091 g |
| 1-Methoxy-2-propanol | 8.609 g |

Binder polymer (1):

[structure]

Polymerization initiator (1):

[structure]

Infrared absorbing agent (1):

[structure]

Fluorine-containing surfactant (1):

[structure]

(4) Formation of Image Recording Layer

The microcapsule dispersion and the sensitizing solution were mixed and stirred together to give a coating solution for image recording layer. Immediately after the preparation, the coating solution for image recording layer was bar-coated on the substrate and dried in an oven at 100° C. for 60 seconds to form an image recording layer of a dry coating amount of 1.0 g/m². Thus, a lithographic printing plate precursor was produced.

Examples 2 to 5

Lithographic printing plate precursors were produced as in EXAMPLE 1 but using the compounds listed in Table 1 as substitutes for the compound (2) employed in EXAMPLE 1.

Comparative Example 1

A lithographic printing plate precursor was produced as in EXAMPLE 1 but adding no compound (2) employed in EXAMPLE 1.

Comparative Example 2

A lithographic printing plate precursor was produced as in EXAMPLE 1 but using the following compound (x) as a substitute for the compound (2) employed in EXAMPLE 1.

Compound (x):

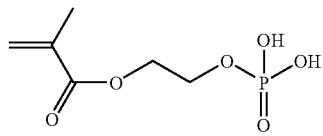

-continued

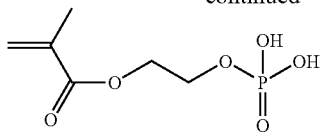

(Evaluation of Lithographic Printing Plate Precursor)

Each lithographic printing plate precursor thus obtained was exposed to Luxel T9000CTP (manufactured by Fuji Photofilm) provided with an infrared semiconductor laser. The printing plate precursor thus exposed was not subjected to a development treatment but loaded on the cylinder of a printing machine SOR-M (manufactured by Heidelberg). Using a fountain solution (IF102, etching solution manufactured by Fuji Photofilm)/water=4/9 (by volume) and a black ink VALUES (N) (manufactured by Dainippon Ink and Chemicals), the fountain solution and the ink were supplied and printing was performed at a speed of 6,000 sheets per hour.

(1) Sensitivity

In the exposure of a lithographic printing plate precursor, the plate face energy was changed by altering the rotational speed of the outer drum. Then the sensitivity was evaluated based on the minimum exposure dose allowing image formation. Table 1 summarizes the results.

(2) Removability (Onboard Development Properties)

Removability (onboard development properties) was evaluated from the number of print sheets needed until the unexposed parts in the image recording layer were completely removed on the printing machine and the ink was not transferred to printing paper any more. Table 1 summarizes the results.

(3) Printing Tolerance

After the completion of the onboard development, printing was further continued. With an increase in the number of print sheets, the image recording layer abraded away and its ink receiving capacity was reduced. As a result, the ink density on print sheets was lowered. Printing tolerance was evaluated from the number of print sheets showing a decrease in the ink density (reflection density) of 0.1 compared at the initiation of the printing. Table 1 summarizes the results.

(4) Stain Resistance

After the evaluation of removability (2), the lithographic printing plate precursor was allowed to stand for an hour. Then printing was performed again. The stain resistance was evaluated from the number of print sheets needed until normal print, in which the ink adhered to an exposed part but not to an unexposed part, was obtained. Table 1 summarizes the results.

(5) Chemical Resistance

The procedure of testing printing tolerance (3) was followed but a multcleaner (manufactured by Fuji Photofilm) was brought into close contact with the image recording layer surface for one minute followed by wiping with water for each 500 sheets. Chemical resistance was evaluated from the number of print sheets showing a decrease in the ink density (reflection density) of 0.1 compared at the initiation of the printing. Table 1 summarizes the results.

TABLE 1

| Lithographic printing plate precursor | Compound | Sensitivity | Removability | Printing tolerance | Stain resistance | Chemical resistance |
|---|---|---|---|---|---|---|
| Ex. 1 | (2) | 70 | 30 | 50000 | 35 | 50000 |
| Ex. 2 | (9) | 70 | 35 | 60000 | 40 | 45000 |
| Ex. 3 | (15) | 70 | 35 | 50000 | 35 | 40000 |
| Ex. 4 | (P-3) | 70 | 25 | 55000 | 35 | 55000 |
| Ex. 5 | (P-11) | 70 | 35 | 60000 | 35 | 45000 |
| C. Ex. 1 | No | 200 | 50 | 5000 | 45 | ≦1000 |
| C. Ex. 2 | (x) | 60 | 80 | 50000 | 200 | 35000 |

(Note)
P-3: x/y/z = 20/40/40 (average m.w.: 30000)
P-11: x/y/z = 30/40/30 (average m.w.: 30000)

Example 6

On the support produced in EXAMPLE 1, a coating solution of image recording layer of the following composition was bar-coated and dried in an oven at 100° C. for 60 seconds to form an image recording layer of a dry coating amount of 1.0 g/m². Thus, a lithographic printing plate precursor was produced.

| Coating solution for image recording layer | |
|---|---|
| Infrared absorbing agent (2) employed in EX. 1 | 0.05 g |
| Polymerization initiator (1), see below | 0.20 g |
| Binder polymer (2), see below | 0.50 g |
| Compound (4) | 0.10 g |
| Ethylene oxide isocyanurate-denatured triacrylate (polymerizable compound, NK ester M-315 manufactured by Shin Nakamura Kagaku Kogyo) | 1.00 g |
| Victoria Pure Blue naphthalenesulfonate | 0.02 g |
| F-containing surfactant (1) employed in EX. 1 | 0.10 g |
| Methyl ethyl ketone | 18.0 g |

Polymerization initiator (1):

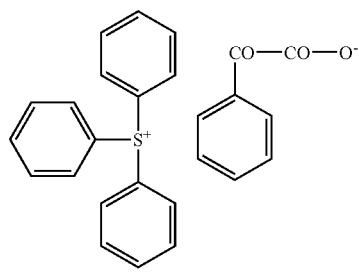

Binder polymer (2), average molecular weight: 80000:

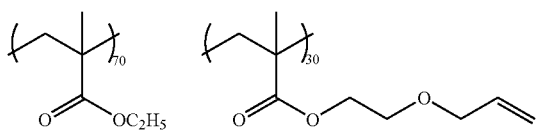

Examples 7 to 10

Lithographic printing plate precursors were produced as in EXAMPLE 6 but using the compounds listed in Table 2 as substitutes for the compound (4) employed in EXAMPLE 6.

Comparative Example 3

A lithographic printing plate precursor was produced as in EXAMPLE 6 but adding no compound (4) employed in EXAMPLE 6.

Comparative Example 4

A lithographic printing plate precursor was produced as in EXAMPLE 6 but using the following compound (x) as a substitute for the compound (4) employed in EXAMPLE 6.

(Evaluation of Lithographic Printing Plate Precursor)

Each lithographic printing plate precursor thus obtained was evaluated as in EXAMPLES 1 to 5 and COMPARATIVE EXAMPLES 1 and 2. Table 2 summarizes the results.

Next, a coating solution for image recording layer was prepared as in EXAMPLE 1 but adding no compound (2).

The coating solution of image recording layer thus prepared was bar-coated on the undercoated substrate and dried in an oven at 100° C. for 60 seconds to form an image recording layer of a dry coating amount of 1.0 g/m$^2$. Thus, a lithographic printing plate precursor was produced.

Examples 12 to 15

Lithographic printing plate precursors were produced as in EXAMPLE 11 but using the compounds listed in Table 2 as substitutes for the compound (4) employed in EXAMPLE 11.

Comparative Example 5

A lithographic printing plate precursor was produced as in EXAMPLE 11 but using the following compound (x) as a substitute for the compound (4) employed in EXAMPLE 11.

(Evaluation of Lithographic Printing Plate Precursor)

Each lithographic printing plate precursor thus obtained was evaluated as in EXAMPLES 1 to 5 and COMPARATIVE EXAMPLES 1 and 2. Table 3 summarizes the results.

TABLE 2

| Lithographic printing plate precursor | Compound | Sensitivity | Removability | Printing tolerance | Stain resistance | Chemical resistance |
|---|---|---|---|---|---|---|
| Ex. 6 | (4) | 80 | 35 | 45000 | 40 | 55000 |
| Ex. 7 | (2) | 80 | 40 | 50000 | 40 | 55000 |
| Ex. 8 | (17) | 80 | 35 | 50000 | 40 | 45000 |
| Ex. 9 | (P-8) | 80 | 40 | 55000 | 40 | 55000 |
| Ex. 10 | (P-11) | 80 | 30 | 45000 | 25 | 55000 |
| C. Ex. 3 | No | 250 | 50 | 45000 | 55 | ≦1000 |
| C. Ex. 4 | (x) | 70 | 90 | 40000 | 200 | 30000 |

(Note)
P-8: x/y/z = 20/40/40 (average m.w.: 30000)
P-11: x/y/z = 30/40/30 (average m.w.: 30000)

Example 11

On the support produced in EXAMPLE 1, a 13% by mass methanol solution of the compound (4) was bar-coated and dried in an oven at 70° C. for 60 seconds to form an undercoat layer of a dry coating amount of 0.05 g/m$^2$.

TABLE 3

| Lithographic printing plate precursor | Compound | Sensitivity | Removability | Printing tolerance | Stain resistance | Chemical resistance |
|---|---|---|---|---|---|---|
| Ex. 11 | (4) | 60 | 30 | 605000 | 40 | 50000 |
| Ex. 12 | (11) | 60 | 30 | 65000 | 40 | 40000 |
| Ex. 13 | (18) | 60 | 35 | 50000 | 40 | 45000 |
| Ex. 14 | (P-3) | 60 | 40 | 60000 | 45 | 55000 |
| Ex. 15 | (P-18) | 60 | 45 | 55000 | 50 | 55000 |
| C.Ex. 5 | (x) | 60 | 100 | 55000 | 250 | 40000 |

(Note)
P-3 x/y/z = 20/40/40 (average m.w.: 30000)
P-11: x/y/z = 30/40/30 (average m.w.: 30000)

This application is based on Japanese Patent application JP 2004-134480, filed Apr. 28, 2004, the entire content of which is hereby incorporated by reference, the same as if set forth at length.

The invention claimed is:

1. A lithographic printing plate precursor comprising
an image recording layer containing a sensitizing dye,
a polymerization initiator,
a polymerizable compound and a binder polymer and
a hydrophilic support,
wherein the image recording layer or a layer optionally provided between the image recording layer and the hydrophilic support contains a compound capable of forming an adsorptive group to the hydrophilic support due to heat, an acid or a radical selected from the group consisting of a sulfonate group (—SO$_3$H), a sulfate group (—OSO$_3$H), —SO$_2$NHSO$_2$— and —COCH$_2$COCH$_3$—.

2. The lithographic printing plate precursor according to claim 1, wherein the compound capable of forming an adsorptive group to the hydrophilic support due to heat, an acid or a radical has an ethylenically unsaturated bond.

3. The lithographic printing plate precursor according to claim 1, wherein the compound capable of forming an adsorptive group to the hydrophilic support due to heat, an acid or a radical is a polymer.

4. The lithographic printing plate precursor according to claim 1, wherein the compound capable of forming an adsorptive group to the hydrophilic support due to heat, an acid or a radical is a polymer having an ethylenically unsaturated bond.

5. The lithographic printing plate precursor according to claim 1, wherein the adsorptive group is an acid group or an onium group.

6. The lithographic printing plate precursor according to claim 1, wherein the compound capable of forming an adsorptive group to the hydrophilic support due to heat, an acid or a radical is a compound represented by the following formula (I),

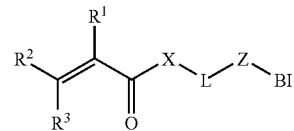

wherein R$^1$, R$^2$ and R$^3$ each independently represents a hydrogen atom, a halogen atom or an alkyl group having from 1 to 6 carbon atoms; X represents —O— or —NH—; L represents a divalent linking group; Z represents a adsorptive group to the hydrophilic support; and Bl represents a protecting group for the adsorptive group removable by heat, an acid or a radical.

7. The lithographic printing plate precursor according to claim 1, wherein the lithographic printing plate precursor further comprises an undercoat layer between the image recording layer and the hydrophilic support, and the undercoat layer contains the compound capable of forming an adsorptive group to the hydrophilic support due to heat, an acid or a radical.

8. A printing method comprising:
loading a lithographic printing plate precursor comprising an image recording layer containing a sensitizing dye,
a polymerization initiator, a polymerizable compound and a binder polymer and a hydrophilic support,
wherein the image recording layer or a layer optionally provided between the image recording layer and the hydrophilic support contains a compound capable of forming an adsorptive group to the hydrophilic support due to heat, an acid or a radical from the group consisting of a sulfonate group (—SO$_3$H), a sulfate group (—OSO$_3$H), —SO$_2$NHSO$_2$— and —COCH$_2$COCH$_3$—, on a printing machine and imagewise exposing the loaded lithographic printing plate precursor to laser beams, or
imagewise exposing the lithographic printing plate precursor and loading the imagewise exposed lithographic printing plate precursor on the printing machine; and
supplying an printing ink and a fountain solution to thereby remove an unexposed part of the image recording layer by the printing ink or the fountain solution.

* * * * *